United States Patent
Jeon et al.

(10) Patent No.: US 10,181,513 B2
(45) Date of Patent: Jan. 15, 2019

(54) POWER DEVICE CONFIGURED TO REDUCE ELECTROMAGNETIC INTERFERENCE (EMI) NOISE

(71) Applicant: FAIRCHILD KOREA SEMICONDUCTOR LTD., Bucheon-si (KR)

(72) Inventors: Jae-duck Jeon, Incheon (KR); Young-chul Kim, Gimpo-Si (KR); Kyeong-seok Park, Bucheon-si (KR); Jin-myung Kim, Goyang-si (KR); Young-chul Choi, Seoul (KR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/742,328

(22) Filed: Jun. 17, 2015

(65) Prior Publication Data
US 2015/0287786 A1 Oct. 8, 2015

Related U.S. Application Data

(63) Continuation-in-part of application No. 14/316,248, filed on Jun. 26, 2014, and a continuation-in-part of (Continued)

(30) Foreign Application Priority Data

Apr. 24, 2012 (KR) .................. 10-2012-0042717
Apr. 19, 2013 (KR) .................. 10-2013-0043817
(Continued)

(51) Int. Cl.
*H01L 29/36* (2006.01)
*H01L 29/10* (2006.01)
(Continued)

(52) U.S. Cl.
CPC ...... *H01L 29/1095* (2013.01); *H01L 21/2253* (2013.01); *H01L 21/26513* (2013.01);
(Continued)

(58) Field of Classification Search
CPC ............. H01L 29/1095; H01L 29/0615; H01L 29/0834; H01L 29/36; H01L 29/7395; H01L 29/7397
(Continued)

(56) References Cited

U.S. PATENT DOCUMENTS

| 4,369,072 A | 1/1983 | Bakeman, Jr. et al. |
| 4,823,176 A | 4/1989 | Baliga et al. |

(Continued)

FOREIGN PATENT DOCUMENTS

| CN | 102446966 A | 5/2012 | |
| JP | WO 2011052787 A1 * | 5/2011 | ........... H01L 21/263 |

*Primary Examiner* — Robert T Huber
(74) *Attorney, Agent, or Firm* — Brake Hughes Bellermann LLP

(57) ABSTRACT

A power device having fast switching characteristic, while keeping EMI noise to a minimum and a method of fabricating the same are provided. The power device includes a first field stop layer having a first conductivity type, a first drift region formed on the first field stop layer and having a first conductivity type in an impurity concentration that is lower than the first field stop layer, a buried region formed on the first drift region and having the first conductivity type in an impurity concentration that is higher than the first drift region, a second drift region formed on the buried region, a power device cell formed at an upper portion of the second drift region, and a collector region formed below the first field stop layer.

27 Claims, 33 Drawing Sheets

Related U.S. Application Data application No. 13/868,629, filed on Apr. 23, 2013, application No. 14/742,328, which is a continuation-in-part of application No. 13/868,629.

(60) Provisional application No. 62/013,304, filed on Jun. 17, 2014, provisional application No. 61/840,444, filed on Jun. 27, 2013.

(30) Foreign Application Priority Data

Dec. 23, 2013 (KR) ........................ 10-2013-0161778
Jun. 2, 2015 (KR) ........................ 10-2015-0078244

(51) Int. Cl.
*H01L 29/66* (2006.01)
*H01L 21/265* (2006.01)
*H01L 29/739* (2006.01)
*H01L 29/06* (2006.01)
*H01L 29/08* (2006.01)
*H01L 21/225* (2006.01)

(52) U.S. Cl.
CPC ...... *H01L 29/0615* (2013.01); *H01L 29/0834* (2013.01); *H01L 29/36* (2013.01); *H01L 29/66333* (2013.01); *H01L 29/66348* (2013.01); *H01L 29/7395* (2013.01); *H01L 29/7397* (2013.01)

(58) Field of Classification Search
USPC .................................. 257/329, 487, E29.262
See application file for complete search history.

(56) References Cited

U.S. PATENT DOCUMENTS

| | | |
|---|---|---|
| 5,032,880 A | 7/1991 | Tsunoda |
| 5,569,941 A | 10/1996 | Takahashi |
| 5,701,023 A | 12/1997 | Bulucea et al. |
| 5,838,027 A | 11/1998 | Kim et al. |
| 6,426,248 B2 | 7/2002 | Francis et al. |
| 6,482,681 B1 | 11/2002 | Francis et al. |
| 6,524,894 B1 | 2/2003 | Nozaki et al. |
| 6,559,023 B2 | 5/2003 | Otsuki et al. |
| 6,621,120 B2 | 9/2003 | Otsuki et al. |
| 6,686,613 B2 | 2/2004 | Matsudai et al. |
| 6,707,111 B2 | 3/2004 | Francis et al. |
| 6,762,080 B2 | 7/2004 | Linder |
| 6,798,040 B2 | 9/2004 | Reznik |
| 6,825,110 B2 | 11/2004 | Linder et al. |
| 7,361,970 B2 | 4/2008 | Barthelmess et al. |
| 7,645,659 B2 | 1/2010 | Yun et al. |
| 7,989,888 B2 * | 8/2011 | Schulze ............. H01L 29/0834 257/335 |
| 8,766,413 B2 | 7/2014 | Nemoto et al. |
| 2006/0286753 A1 | 12/2006 | Barthelmess et al. |
| 2007/0120215 A1 | 5/2007 | Yun et al. |
| 2010/0015818 A1 | 1/2010 | Barthelmess et al. |
| 2010/0078775 A1* | 4/2010 | Mauder ............. H01L 29/0615 257/655 |
| 2010/0167509 A1 | 7/2010 | Schulze et al. |
| 2012/0267681 A1* | 10/2012 | Nemoto ............. H01L 21/263 257/139 |
| 2013/0277793 A1 | 10/2013 | Lee et al. |
| 2014/0312382 A1 | 10/2014 | Lee et al. |

\* cited by examiner

POWER DEVICE CONFIGURED TO REDUCE ELECTROMAGNETIC INTERFERENCE (EMI) NOISE

CROSS-REFERENCE TO RELATED APPLICATIONS

This application claim priority to and the benefit of U.S. Provisional Application No. 62/013,304, filed on Jun. 17, 2014 with the United States Patent and Trademark Office, and Korean Patent Application No. 10-2015-0078244, filed on Jun. 2, 2015 with the Korean Intellectual Property Office, the disclosures of which are incorporated herein by reference in their entireties.

This application is a continuation-in-part of U.S. patent application Ser. No. 14/316,248, filed on Jun. 26, 2014, which claims priority to and the benefit of U.S. Provisional Application No. 61/840,444, filed on Jun. 27, 2013 and Korean Application No. 10-2013-0161778, filed on Dec. 23, 2013, Korean Application No. 10-2013-0043817, filed on Apr. 19, 2013 and Korean Application No. 10-2012-0042717, filed on Apr. 24, 2012, with the Korean Intellectual Property Office, and which is a continuation-in-part of U.S. patent application Ser. No. 13/868,629, filed on Apr. 23, 2013, the disclosures of which are incorporated herein by reference in their entireties.

This application is also a continuation-in-part of U.S. patent application Ser. No. 13/868,629, filed on Apr. 23, 2013, which claims priority to and the benefit of Korean Application No. 10-2013-0043817, filed on Apr. 19, 2013 and Korean Application No. 10-2012-0042717, filed on Apr. 24, 2012, with the Korean Intellectual Property Office, the disclosures of which are incorporated herein by reference in their entireties.

TECHNICAL FIELD

The present disclosure relates to a power device and a method for fabricating the same, and more particularly, to a power device capable of reducing an electromagnetic interference (EMI) noise and a method for fabricating the same.

BACKGROUND

Recently, the insulated gate bipolar transistor (IGBT) has gained increasing attention as a power semiconductor device satisfying both fast switching characteristic of the high power MOSFET and large power characteristic of the bipolar junction transistor (BJT). Among a variety of IGBT structures, the field stop (FS) type IGBT can be understood as the soft punch through type or shallow punch through type IGBT. This FS-IGBT can be understood to be a combination of non-punch through (NPT) IGBT and punch through (PT) IGBT technologies, according to which associated advantages such as low saturation collector voltage (Vice, sat), easy parallel operation and ruggedness are provided.

Nevertheless, such fast switching characteristic of the FS-IGBT can result in shortcoming of increased EMI noise during turn-off switching.

SUMMARY

Exemplary embodiments overcome the above disadvantages and other disadvantages not described above. Also, the concepts disclosed herein are not required to overcome the disadvantages described above, and exemplary embodiments may not overcome any of the problems described above.

At least some embodiments are configured to provide a power device having fast switching characteristic, while also minimizing electromagnetic interference (EMI) noise, and a method for fabricating the same.

The embodiments described herein can be configured to provide a power device described below. According to an embodiment, a power device may include a first field stop layer having a first conductivity type, a first drift region formed on the first field stop layer and having the first conductivity type in an impurity concentration lower than the first field stop layer, a buried region formed on the first drift region and having the first conductivity type in an impurity concentration higher than the first drift region, a second drift region formed on the buried region, a power device cell formed at an upper portion of the second drift region, and a collector region formed below the first field stop layer.

The power device may additionally include a second field stop layer disposed between the first field stop layer and the first drift region, and having the first conductivity type provided with an impurity concentration portion that is higher than the first field stop layer.

The second field stop layer may have a higher impurity concentration than the buried region.

The second field stop layer may have such an impurity concentration that increases from the first field stop layer to reach a maximum impurity concentration, and then decreases to the first drift region.

The first drift region may be formed by an epitaxial growth on the second field stop layer.

The second field stop layer may be formed by an ion implantation process so that the impurity concentration is higher than the first field stop layer.

The second field stop layer may be formed of a first region having a first impurity concentration, and a second region having a second impurity concentration which is higher than the first impurity concentration.

An average impurity concentration of the second region may be higher than an average impurity concentration of the first region.

The second drift region may have the first conductivity type in an impurity concentration that is lower than the buried region, and the first and second drift regions may each have a constant impurity concentration profile in a depth direction.

The impurity concentrations of the first drift region and the second drift region may be substantially same.

The second drift region may include a first conductivity type pillar and a second conductivity type pillar, each of which are formed by extending on the buried region in a perpendicular direction and in alternate arrangement in a horizontal direction, and the first conductivity type pillar may have a lower impurity concentration than the buried region.

The buried region may have an impurity concentration which increases from the first drift region to reach a maximum impurity concentration, and then decreases to the second drift region.

The buried region may have an impurity concentration profile in which the first drift region and the second drift region are in a symmetric shape with reference to a portion having a maximum impurity concentration.

The first field stop layer may have a constant impurity concentration profile in a depth direction.

The collector region may have a second conductivity type which is different from the first conductivity type.

A thickness value of the second drift region may be larger than a thickness value of the first drift region.

The power device cell may include a base region disposed at an upper portion of the second drift region and having a second conductivity type which is different from the first conductivity type, an emitter region disposed on a surface portion within the base region and having the first conductivity type, and a gate electrode formed by interposing a gate insulating layer on the second drift region, the base region and the emitter region.

The power device cell may include a base region disposed at an upper portion of the second drift region and having a second conductivity type which is different from the first conductivity type, an emitter region disposed on a surface portion within the base region and having the first conductivity type, a gate electrode disposed on one side surface of the base region and the emitter region, and formed by being buried in the second drift region, and a gate insulating layer disposed between the base region, the emitter region and the second drift region, and the gate electrode.

According to an embodiment of the present disclosure, a method for fabricating a power device may include preparing a semiconductor substrate having a first conductivity type, forming a first drift region by epitaxial growth on a front surface of the semiconductor substrate to provide an impurity concentration of the first conductivity type that is lower than the semiconductor substrate, forming a buried region by ion-implanting impurity ions having the first conductivity type on a front surface of the first drift region, forming a second drift region on the buried region, forming a power device cell at an upper portion of the second drift region, forming a first field stop layer by grinding a back surface which is opposite to the front surface of the semiconductor substrate, and forming a collector region at a lower portion of the first field stop layer.

The forming the second drift region may include epitaxial growing on a front surface of the buried region to provide the impurity concentration of the first conductivity type that is lower than the semiconductor substrate.

The second drift region may be formed to have the first conductivity type in the impurity concentration that is lower than the buried region, and the first and second drift regions may each have a constant impurity concentration profile in a depth direction.

The forming the second drift region may include epitaxial growing to provide the impurity concentration of the first conductivity type that is substantially same as the first drift region.

The buried region may be formed such that the impurity concentration increases from the first drift region to reach a maximum impurity concentration, and then decreases to the second drift region.

An impurity concentration profile of the buried region may be formed such that a symmetry is formed between the first drift region and the second drift region.

Prior to forming the first drift region, the method may additionally include forming a second field stop layer having a higher impurity concentration portion than the semiconductor substrate, by ion-implanting impurity ions having the first conductivity type on the front surface of the semiconductor substrate.

The second field stop layer may have a higher impurity concentration than the buried region.

The forming the second field stop layer may include first ion implantation of forming an implanted layer by ion-implanting impurity ions having the first conductivity type on the front surface of the semiconductor substrate, and second ion implantation of ion-implanting impurity ions having the first conductivity type into a portion of the implanted layer so that the impurity concentration of the portion of the implanted layer is higher than the impurity concentration of the rest portion of the implanted layer.

The forming the power device cell may include forming a base region having a second conductivity type different from the first conductivity type on a predetermined area of a surface of the second drift region, forming an emitter region having the first conductivity type on a predetermined area of a surface of the base region, forming a gate electrode by interposing a gate insulating layer on the second drift region, the base region and the emitter region, and forming an emitter electrode on the base region and the emitter region.

The forming the power device cell may include forming a base region having a second conductivity type different from the first conductivity type on a predetermined area of a surface of the second drift region, forming an emitter region having the first conductivity type on a predetermined area of a surface of the base region, forming a trench having a receiving space therein adjacent to one side surface of the base region and the emitter region, by digging from a surface of the second drift region to a predetermined depth, forming a gate insulating layer for covering an inner surface of the trench, forming a gate electrode within the trench which has the gate insulating layer formed therein, and forming an emitter electrode on the base region and the emitter region.

The forming the collector region may include ion-implanting impurity ions having a second conductivity type different from the first conductivity type in a lower portion of the second field stop layer.

With the power device and a method for fabricating the same according to embodiments of the present disclosure, the current tail of the holes can be reduced so that fast switching during turn-off switching is enabled. Further, the power device and a method for fabricating the same according to embodiments of the present disclosure can minimize generation of the EMI noise, as it is possible to prevent overshooting which is an excessive voltage increase during turn-off switching.

Accordingly, the power device and a method for fabricating the same according to embodiments of the present invention can have fast switching characteristic, while keeping the EMI noise to a relatively low value or minimum.

DETAILED DESCRIPTION

Certain exemplary embodiments of the present disclosure will now be described in greater detail with reference to the accompanying drawings to assist in a comprehensive understanding of constitution and effects of the present disclosure. However, the present disclosure is not limited to the embodiments disclosed herein, but can be implemented in a variety of configurations with a variety of modifications. Accordingly, it is apparent that the exemplary embodiments of the present disclosure are provided to perfect the present disclosure, and to inform those skilled in the art of the scope of the present disclosure completely. For convenience of explanation, certain elements may be enlarged from actual size, and the respective elements may be illustrated on an exaggerated or reduced scale.

When an element is stated as being "on" or "in contact with" another element, it may be understood that the element may be contacted with, or connected to another element directly, or contacted or connected via yet another element which may be present in between. On the contrary, when a certain element is stated as being "directly on" or "directly contacted with" another element, it may be understood that presence of any intervening element therebetween is foreclosed. Other expressions such as "between" or "directly between" that explains relationship among elements may be interpreted likewise.

The expression of "first" or "second" may be used to explain a variety of elements, but should not be construed as limiting the elements. The expressions may be used exclusively for the purpose of distinguishing one element from another. For example, without departing from the scope of the present disclosure, the first element may be referred to as the second element, or likewise, the second element may be referred to as the first element.

Unless otherwise explicitly stated, a singular expression encompasses a plural expression. The wording such as "comprise" or "have" used herein is intended to designate presence of characteristic, number, step, operation, element, component or a combination thereof, and may be interpreted as being open to addition of one or more other characteristics, numbers, steps, operations, elements, components or combination thereof.

Unless otherwise defined, the terms and expressions used herein may be interpreted in their meanings as generally known to those skilled in the art.

Hereinbelow, certain embodiments of the present disclosure will be explained in detail with reference to the accompanying drawings.

Figure 1:
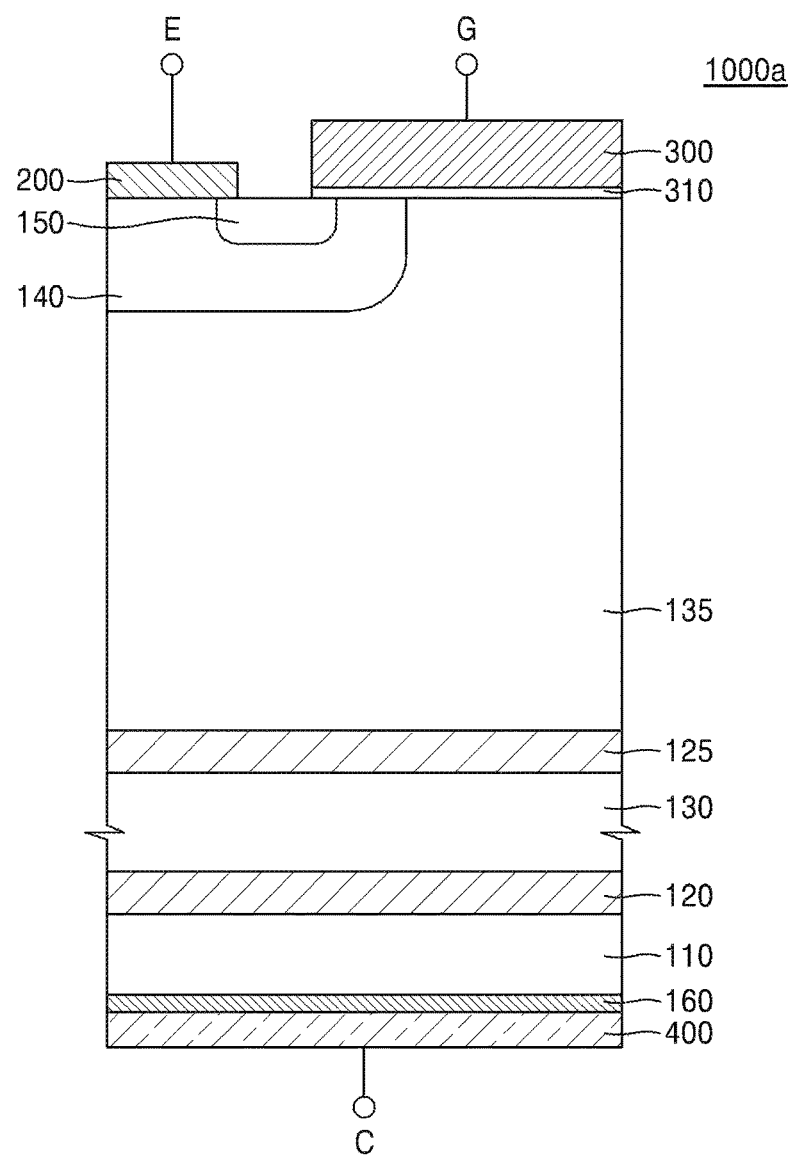
FIG. 1 is a cross sectional view of a power device according to an embodiment of the present disclosure.

FIG. 1 is a cross sectional view of a power device according to an embodiment of the present disclosure.

Referring to FIG. 1, a power device 1000a includes a first field stop layer 110, a first drift region 130, a buried region 125, a second drift region 135, a base region 140, an emitter region 150 and a collector region 160. The power device 1000a may additionally include a second field stop layer 120.

The first field stop layer 110 may be formed based on a semiconductor substrate. For example, the first field stop layer 110 may be formed by using a semiconductor substrate having a first conductivity type. The semiconductor substrate herein may be a substrate with impurity doped thereon to provide an impurity concentration that is sufficient to form a field stop layer in a field stop-insulated gate bipolar transistor (FS-IGBT), i.e., to provide the impurity concentration that is sufficient to block expansion of the depletion region to the second conductivity type collector region 160 formed on the surface of the semiconductor substrate opposite to the first drift region 130. The impurity concentration of the semiconductor substrate to form the first field stop layer 110 may be approximately $1E^{14}$ to $1E^{16}/cm^3$, for example. For example, the first conductivity type may be an N-type, the second conductivity type may be a P-type, and the semiconductor substrate to form the first stop layer 110 may be an $N^0$ semiconductor substrate doped with an N-type impurity.

As described, the first field stop layer 110 based on the semiconductor substrate may have almost constant impurity concentration profile in a depth direction, i.e., in a direction from the first drift region 130 to the collector region 160. That is, the first field stop layer 110 may have uniform impurity concentration overall.

Further, the semiconductor substrate constructing the first field stop layer 110 may be the one that is produced by the Czochralski (CZ) technique which is advantageous for the large diameter wafer production. The semiconductor substrate by the CZ technique can contribute to the realization of economic power device, as it has more economic efficiency compared to the substrates produced by the float zone (FZ) technique.

The second field stop layer 120 may be formed by ion-implanting the first conductivity type impurity ions on the first field stop layer 110. Specifically, the second field stop layer 120 may be formed by ion-implanting the first conductivity type impurity ions on an upper area of the first conductivity type semiconductor substrate and activating the impurity ions with heat treatment. The impurity concentration of the second field stop layer 120 may have a profile of being gradually increased from the impurity concentration of the first field stop layer 110 up to a maximum impurity concentration, and then gradually decreased to the impurity concentration of the drift region 130 thereabove. For example, the maximum impurity concentration of second field stop layer 120 may be approximately $1E^{15}/cm^3$ to $2E^{17}/cm^3$. Of course, the maximum impurity concentration is not limited to the specific example given above.

Since the first field stop layer 110 is formed based on the semiconductor substrate, and the second field stop layer 120 is formed by ion implantation process, the first field stop layer 110 and the second field stop layer 120 may be interchangeably used as a substrate field stop layer 110 and an implant field stop layer 120, respectively. The second field stop layer 120, together with the first field stop layer 110, may function to prevent (or substantially prevent) expansion of depletion region. Further, the second field stop layer 120 may play a role of a barrier which blocks the holes from flowing from the collector region 160 to the first drift region 130.

The first drift region 130 may be formed by growing an epitaxial layer having the first conductivity type on the second field stop layer 120. The first drift region 130 may be formed to have a lower impurity concentration than that of the first field stop layer 110. Specifically, the first drift region 130 may be formed by growing, on the second field stop layer 120, a first conductivity type epitaxial layer having an impurity concentration suitable for the breakdown voltage of the first conductivity type power device. For example, the first drift region 130 may have a relatively lower impurity concentration which may be $1E^{14}/cm^3$ or below.

The buried region 125 may be formed by ion-implanting the first conductivity type impurity ions on the first drift region 130. Specifically, the buried region 125 may be formed by ion-implanting the first conductivity type impurity ions on the first drift region 130 and activating the impurity ions with heat treatment. The heat treatment to activate the impurity ions may be performed after the second drift region 135 is formed. Accordingly, in the heat treatment to activate the impurity ions, the impurity ions ion-implanted on the first drift region 130 may be partially diffused to the lower area of the second drift region 135, thus constructing the buried region 125 together.

The impurity concentration of the buried layer 125 may have such a profile that gradually increases from the impurity concentration of the first drift region 130 up to the maximum impurity concentration, and then decreases (e.g., gradually decreases) to the impurity concentration of the second drift region 130 thereabove. For example, the maximum impurity concentration of the buried region 125 may be approximately $2E^{14}/cm^3$ to $1E^{16}/cm^3$. Of course, the maximum impurity concentration is not limited to the specific example given above. For example, the buried region 125 may be formed to have a thickness of 5 μm to 20 μm, but not limited thereto. Accordingly, the thickness of the buried region 125 may be determined by an amount of implanted impurity ions and the heat treatment to activate the impurity ions.

The buried region 125 may have an impurity concentration lower than the maximum impurity concentration of the second field stop layer 120. The maximum impurity concentration of the buried region 125 may have an impurity concentration lower than the first field stop layer 110. The buried region 125, which is formed by ion-implanting the first conductivity type impurity ions on the first drift region 130, may have a higher impurity concentration than the first drift region 130. Further, the buried region 125 may have a higher impurity region than the second drift region 135.

The second drift region 135 may be formed by growing an expitaxial layer having the first conductivity type on the buried region 125. This second drift region 135 may be formed such that it has a lower impurity concentration compared to the impurity concentration of the buried region 125. Specifically, the second drift region 135 may be formed by growing, on the buried region 125, a first conductivity type epitaxial layer having an impurity concentration suitable for the breakdown voltage of the first conductivity type power device. For example, the second drift region 135 may have a relatively low impurity concentration which may be $1E^{14}/cm^3$ or below.

The sum of the thickness of the first drift region 130 and the thickness of the second drift region 135 may vary depending on the breakdown voltage as required by the FS-IGBT. For example, when the FS-IGBT requires approximately 600V of breakdown voltage, the sum of the thickness of the first drift region 130 and the thickness of the second drift region 135 may be approximately 60 μm. The thickness value of the second drift region 135 may be larger than the thickness value of the first drift region 130. For example, the first drift region 130 may have a thickness of approximately 5 μm to 20 μm and the second drift region 135 may have a thickness of approximately 40 μm to 55 μm, but not limited thereto. As described, the thickness of the first drift region 130 and the second drift region 135 may respectively vary depending on the breakdown voltage as required by the FS-IGBT.

The first drift region 130 and the second drift region 135 may be so formed as to have substantially the same impurity concentration, and the buried region 125 may be the portion that has a relatively higher impurity concentration between the first drift region 130 and the second drift region 135. When it is assumed that the first and second drift regions 130, 135 are one single drift region 130, 135, the buried region 125 may be a portion that is disposed within the drift region 130, 135, with a higher impurity concentration than the drift region 130, 135.

The base region 140 and the emitter region 150 may be formed at a portion of an upper surface of the second drift region 135. The base region 140 may be formed by selectively ion-implanting the impurity ions having the second conductivity type on the upper surface of the second drift region 135 and diffusing and/or activating the same with heat treatment. For example, the base region 140 may be a high concentration P-type ($P^+$) impurity region. The base region 140 may form a P-N junction with the second drift region 135. Depending on concentration, the base region 140 may include a first base region ($P^{++}$) formed at an upper side, and a second base region ($P^-$) formed below the first base region ($P^{++}$) (not illustrated). For example, the first base region ($P^{++}$) may have $1E^{19}/cm^3$ of impurity concentration, and the second base region ($P^-$) may have approximately $1E^{17}/cm^3$ of impurity concentration.

The emitter region 150 may be formed by ion-implanting impurity ions having the first conductivity type on a predetermined area of the upper surface inside the base region 140, and diffusing and/or activating the same with heat treatment. For example, the emitter region 150 may be a high concentration N-type ($N^+$) impurity region. For example, the emitter region 150 may have an impurity concentration of approximately $1E^{18}/cm^3$ to $1E^{20}/cm^3$.

An emitter electrode 200 may span the base region 140 and the emitter region 150. Further, a gate electrode 300 may be formed over the second drift region 135, the base region 140 and the emitter region 150, while a gate insulating layer 310 is formed in between. The gate electrode 300 may set a channel at the base region 140 existing between the second drift region 135 and the emitter region 150, by application of voltage.

Although not illustrated, an insulating layer and/or a passivation layer may be formed, covering the emitter electrode 200 and the gate electrode 300, etc.

The collector region 160 may be formed below the first field stop layer 110. That is, after grinding of a back surface of the semiconductor substrate, the collector region 160 may be formed by ion-implanting the impurity ions having the second conductivity type to the back surface of the semiconductor substrate and activating the same with heat treatment. The collector region 160 may be formed in a relatively small thickness. For example, the collector region 160 may be formed to have a thickness of 1 μm or below. For example, the collector region 160 may be a high concentration P-type (P⁺) impurity region. The impurity concentration value of the collector region 160 may be larger than the impurity concentration values of the first field stop layer 110 and the second field stop layer 120. A collector electrode 400 may be formed on a lower surface of the collector region 160.

The N-type power device has been exemplified above, but it is of course possible to realize a P-type power device by changing the conductivity type of the impurities of the corresponding regions.

Figure 2:
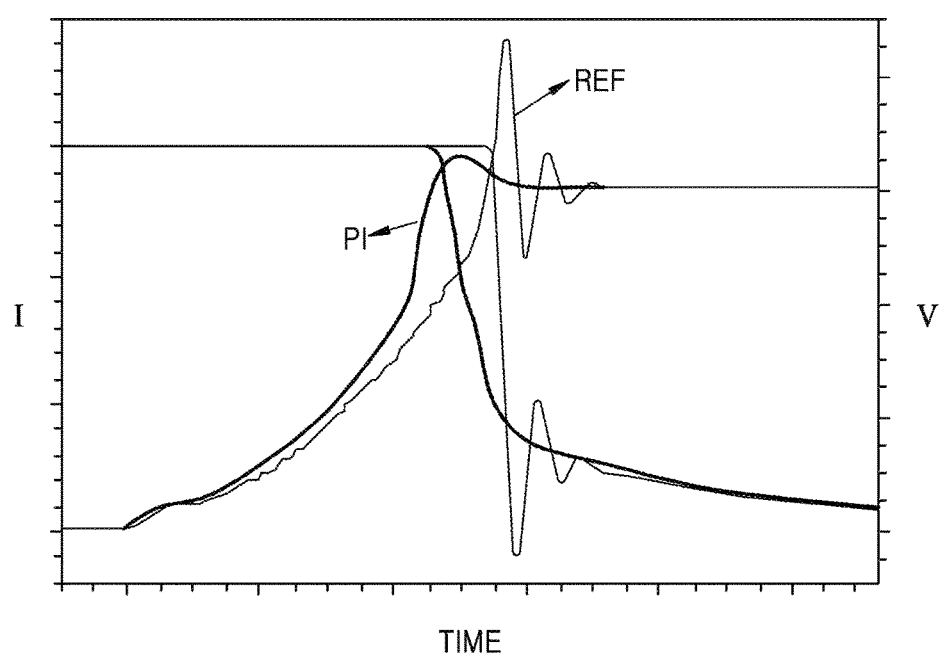
FIG. 2 is a graph representing turn-off switching characteristic of a power device according to an embodiment of the present disclosure.

FIG. 2 is a graph representing turn-off switching characteristic of a power device according to an embodiment of the present disclosure.

Referring to FIG. 2, the turn-off switching characteristic of the power device PI according to the technical concept of the present disclosure is compared with the turn-off switching characteristic of a reference example REF. The reference example REF may be a power device on which the buried region 125 illustrated in FIG. 1 is not formed.

Unlike the power device PI according to the technical concept of the present disclosure, the reference example REF shows overshoot, which is an excessive voltage rise during turn-off switching. The power device PI according to the technical concept of the present disclosure can minimize generation of electromagnetic interference (EMI) noise, as the power device PI rarely shows the overshoot.

Figure 3:
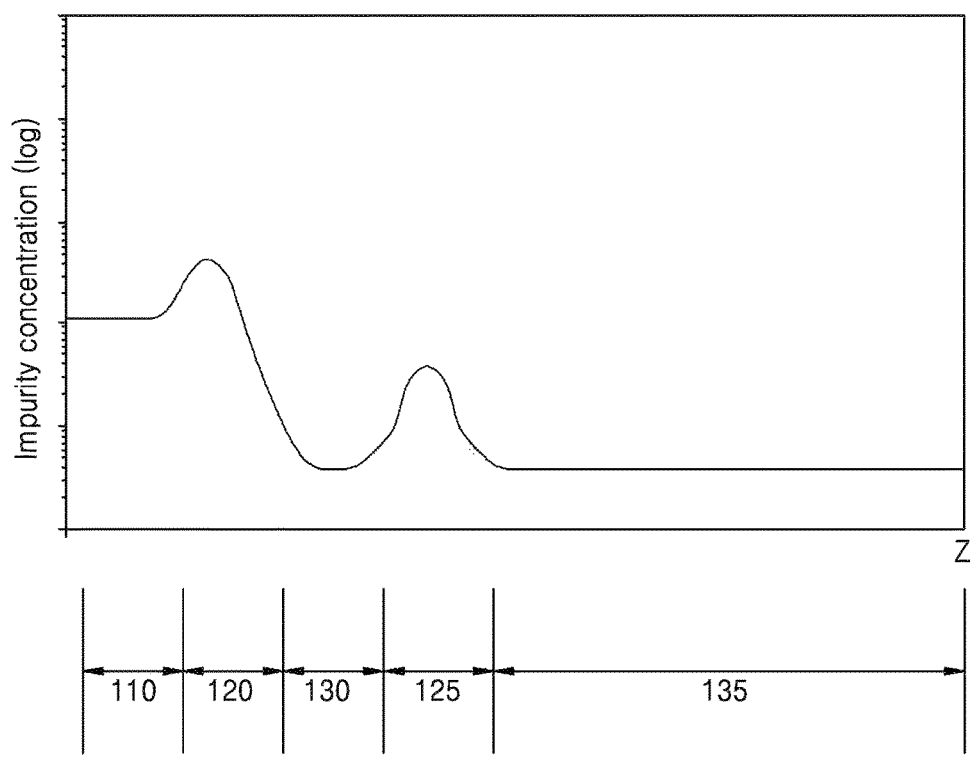
FIG. 3 is a graph representing a profile of impurity concentration depending on depth of a power device, according to an embodiment of the present disclosure.

FIG. 3 is a graph representing a profile of impurity concentration depending on depth of a power device, according to an embodiment of the present disclosure.

Referring to FIGS. 1 and 3, the impurity concentration of the buried region 125 may show a profile in which a portion corresponding to the first drift region 130 and a portion corresponding to the second drift region 135 are in symmetry with reference to a portion having the maximum impurity concentration. That is, the buried region 125 may have the profile of impurity concentration in which the first drift region 130 and the second drift region 135 are in symmetry with each other with reference to the portion having the maximum impurity concentration.

If the drift regions 130, 135 are a continuously-grown epitaxial layer and if the buried region 125 is the portion that is formed by the ion implantation in the drift regions 130, 135 which are the continuously-grown epitaxial layer, the impurity concentration profile of the buried region 125 in a depth direction Z may have a shape of a tail which is relatively elongated in the direction of the ion implantation, i.e., along a path that the impurities are implanted. Accordingly, considering that the thickness of the drift regions 130, 135 may be substantially decreased according to the tail shape of the impurity concentration profile of the buried region 125, the drift regions 130, 135 will have to be formed in a relatively larger thickness.

However, according to the embodiment of the present disclosure, the buried region 125 is formed at an upper portion of the first drift region 130 by ion implantation process, after which the second drift region 135 is formed on the buried region 125. Accordingly, since the buried region 125 does not have a tail-shaped impurity concentration profile along the depth direction Z, which is relatively elongated along a path of the impurity implantation, the first drift region 130 and the second drift region 135 may be formed relatively thinner.

The first field stop layer 110 may have uniform impurity concentration overall. The impurity concentration of the second field stop layer 120 may have such a profile that gradually increases from the impurity concentration of the first field stop layer 110 up to the maximum impurity concentration, and then gradually decreases from the maximum impurity concentration to the impurity concentration of the drift region 130 thereabove. The first drift region 130 may be formed to have a lower impurity concentration compared to the impurity concentration of the first field stop layer 110. The buried region 125 may have a higher impurity region than the first drift region 130 and the second drift region 135.

Referring to FIGS. 1 to 3 together, the first and second field stop layers 110, 120 serve as a barrier which minimizes flow of the holes from the collector region 160 to the first and second drift regions 130, 135. The fast switching is thus enabled, since the current tail of the holes can be reduced while the power device 1000a is in turn-off switching.

Further, the first drift region 130, which has a relatively lower impurity concentration than the second field stop layer 120 and the buried region 125, may be disposed between the second field stop layer 120 and the buried region 125. Accordingly, when the power device 1000a is in turn-off switching, the holes injected from the collector region 160 via the first and second field stop layers 110, 120 are gathered in the first drift region 130 and the second drift region 135, thus preventing overshoot from occurring due to delay in removing the holes in the first drift region 130 due to the buried region 125 during turn-off switching. Accordingly, EMI noise generation can be minimized.

Accordingly, the power device 1000a according to the technical concept of the present disclosure can perform fast switching during turn-off switching, while preventing EMI noise which may be otherwise generated due to overshoot.

Further, due to the presence of the second field stop layer 120 having the higher impurity concentration than the first field stop layer 110, it is still possible to form the collector region 160 of the opposite conductivity even when the thickness of the first field stop layer 110 is reduced. Accordingly, it is possible to sufficiently reduce the thickness of the first field stop layer 110 and thus eventually minimize the sum of the thickness of the first field stop layer 110 and the thickness of the second field stop layer 120.

Further, because the first field stop layer 110 is formed by the back surface grinding based on the semiconductor substrate, high energy ion implantation process for the first field stop layer 110 and the associated annealing diffusion process are not necessary.

FIGS. 4 to 11 are cross sectional views illustrating, in steps, a method for fabricating a power device according to an embodiment of the present disclosure. Specifically, FIGS. 4 to 11 are cross sectional views illustrating respective steps of a method for fabricating the power device 1000a illustrated in FIG. 1.

Figure 4:
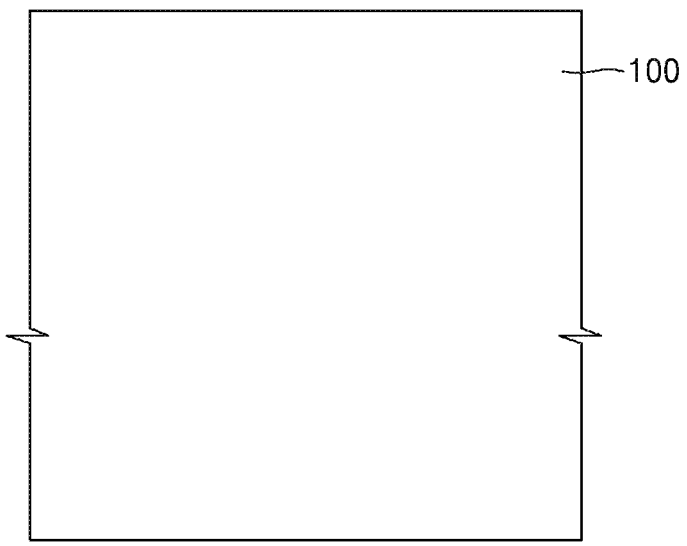
FIGS. 4 to 11 are cross sectional views illustrating a method for fabricating a power device according to an embodiment of the present disclosure.

Referring to FIG. 4, a semiconductor substrate 100 having a first conductivity type is prepared. For example, the first conductivity type may be N type, in which case an N⁰ semiconductor substrate 100 with N-type impurity ions doped thereon is prepared. At this time, the semiconductor substrate 100 may be a substrate doped with N-type impurity in an impurity concentration as required for the field stop layer of the FS-IGBT, i.e., in an impurity concentration sufficient to block expansion of the depletion region to the P-type collector region which will be formed on a surface on a collector side. For example, an $N^0$ semiconductor substrate 100 having approximately $1E^{14}$ to $1E^{16}/cm^3$ of impurity concentration is prepared. As confirmed by the impurity concentration profile of the first field stop layer 110 illustrated in FIG. 3, the impurity concentration profile within the semiconductor substrate 100 may have a certain impurity profile with respect to the depth direction Z of the semiconductor substrate 100.

Meanwhile, the semiconductor substrate 100 may be a substrate that is produced by the Czochralski (CZ) technique which is generally advantageous for the large diameter wafer production. In some implementations, substrates produced by the float zone (FZ) technique can be used.

Figure 5:
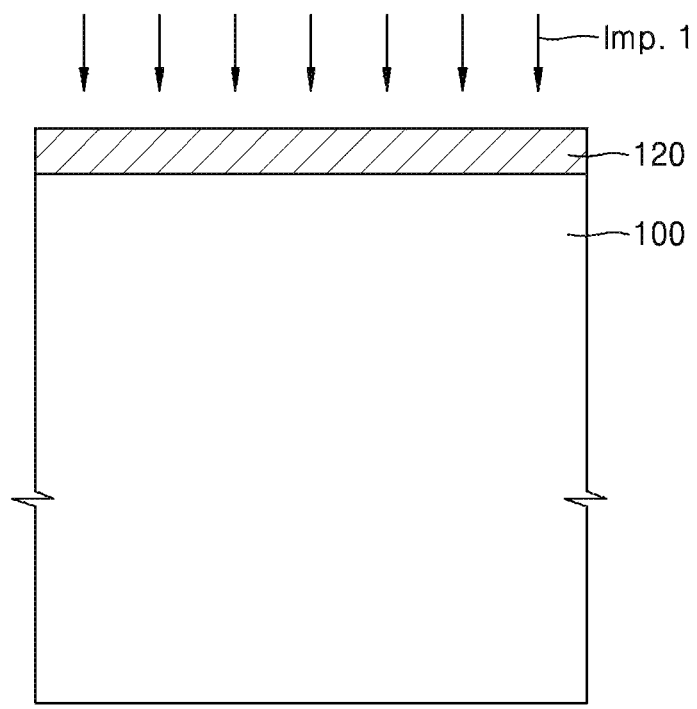

Referring to FIG. 5, the second field stop layer 120 is formed by performing a first ion implant process (Imp. 1) of ion-implanting the first conductivity type impurity ions on the upper region of the semiconductor substrate 100. The impurity concentration of the second field stop layer 120 may vary along the depth direction, and may include $1E^{15}$ to $1E^{17}/cm^3$ impurity concentration portion. The second field stop layer 120 may be formed into a small thickness and may be approximately several microns thick. Depending on cases, the second field stop layer 120 may be formed to be approximately several tens microns thick.

Figure 6:
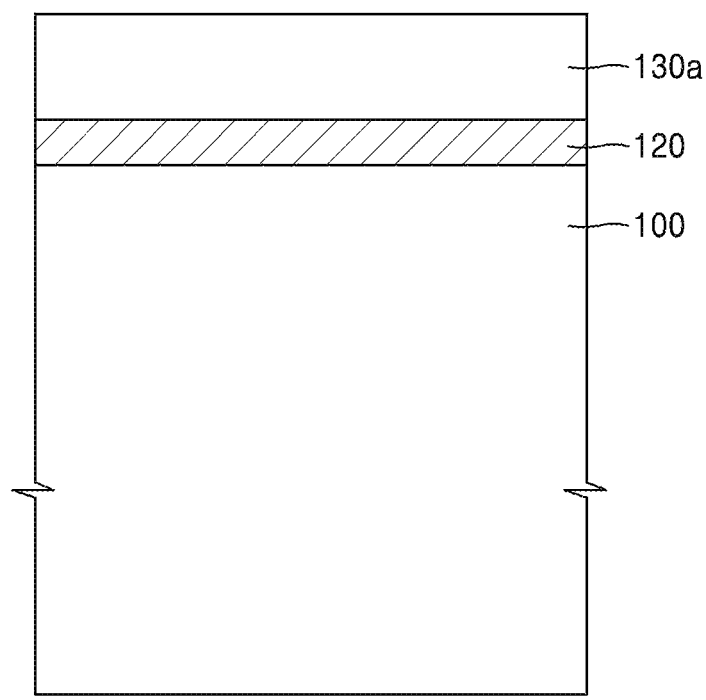

Referring to FIG. 6, a first pre-drift region 130a is formed by growing an epitaxial layer having the first conductivity type on the second field stop layer 120. The first pre-drift region 130a may have a lower impurity concentration than the impurity concentration of the semiconductor substrate 100. The first pre-drift region 130a may be formed by growing an N-type epitaxial layer of a concentration suitable for the breakdown voltage of the N-type power device (e.g., FS-IGBT). The thickness of the first pre-drift region 130a may be formed such that at least a portion of the first pre-drift region 130a remains after the buried region 125 (FIG. 7), which will be described below, is formed over the first pre-drift region 130a. For example, the first pre-drift region 130a may be formed into a thickness of approximately 10 µm to 25 µm. After the buried region 125 (FIG. 7) is formed, at least a portion of the remaining first pre-drift region 130a corresponds to the first drift region 130 illustrated in FIG. 7, and the first drift region 130 may include a portion that maintains the impurity concentration of the first pre-drift region 130a.

Meanwhile, the concentration of the doped impurities for the first pre-drift region 130a may be adjusted during epitaxial growth. Accordingly, the impurity concentration profile of the first pre-drift region 130a in the depth (or thickness) direction may be constant or variable. That is, the impurity concentration profile of the first pre-drift region 130a may vary depending on the intention of the designer. For example, the impurity concentration of the first pre-drift region 130a may be constant depending on depths.

Figure 7:
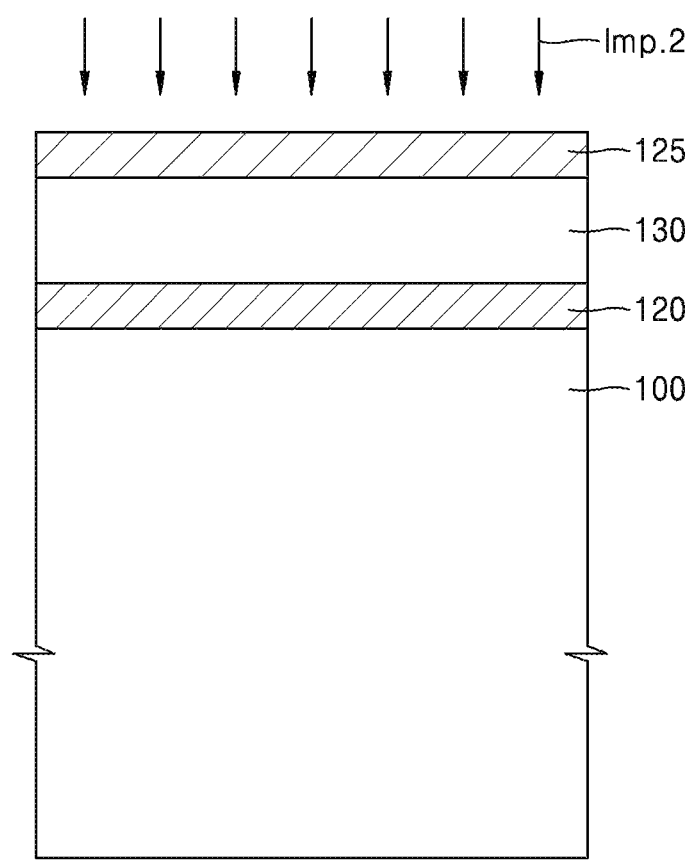

Referring to FIG. 7, the buried region 125 is formed by performing a second ion implant process (Imp. 2) of ion-implanting the first conductivity type impurities ions on the upper area of the first pre-drift region 130a illustrated in FIG. 6. The impurity concentration of the buried region 125 may vary depending on the depth direction Z, and the maximum impurity concentration of the buried region 125 may be approximately $2E^{14}/cm^3$ to $1E^{16}/cm^3$. For example, the buried region 125 may be formed to have a thickness of 5 µm to 20 µm. After the buried region 125 is formed, a portion where the first pre-drift region 130a remains may become the first drift region 130. For example, the first drift region 130 may have a thickness of approximately 5 µm to 20 µm.

Figure 8:
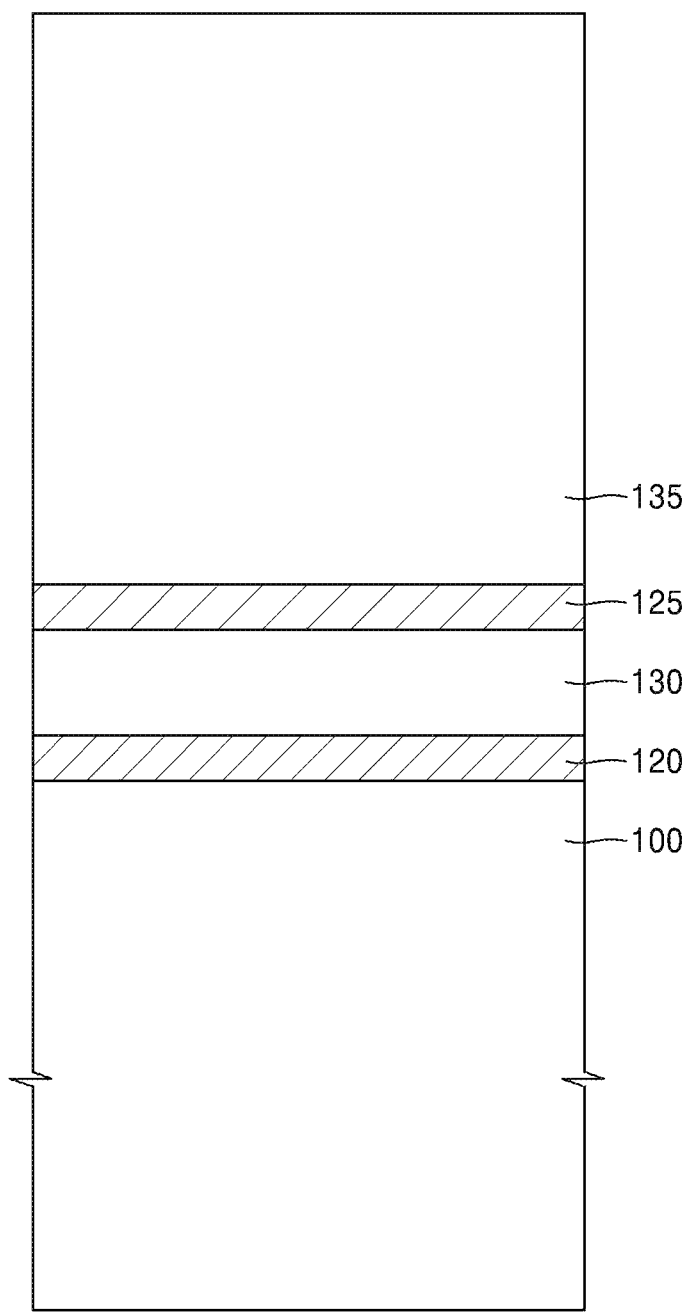

Referring to FIG. 8, the second drift region 135 is formed by growing an epitaxial layer having the first conductivity type on the buried region 125. The second drift region 135 may have a lower impurity concentration than the impurity concentration of the semiconductor substrate 100. The second drift region 135 may be formed by growing an N type epitaxial layer in a concentration suitable for the breakdown voltage of the N-type power device (e.g., FS-IGBT). The thickness of the second drift region 135 may vary depending on the breakdown voltage as required by the FS-IGBT. For example, when approximately 600V of breakdown voltage is required, the sum of the thickness of the first drift region 130 and the thickness of the second drift region 135 may be approximately 60 µm. The thickness of the second drift region 135 may be greater than the thickness of the first drift region 130. For example, the first drift region 130 may be formed into a thickness of approximately 5 µm to 20 µm, and the second drift region 135 may be formed into a thickness of approximately 40 µm to 55 µm.

Meanwhile, the impurity concentration of the second drift region 135 may be adjusted during epitaxial growth. Accordingly, the impurity concentration profile of the second drift region 135 in the depth (or thickness) direction Z may be constant or variable. That is, the impurity concentration profile of the second drift region 135 may be varied depending on the intention of the designer. For example, the impurity concentration of the second drift region 135 may be constant depending on depths.

Figure 9:
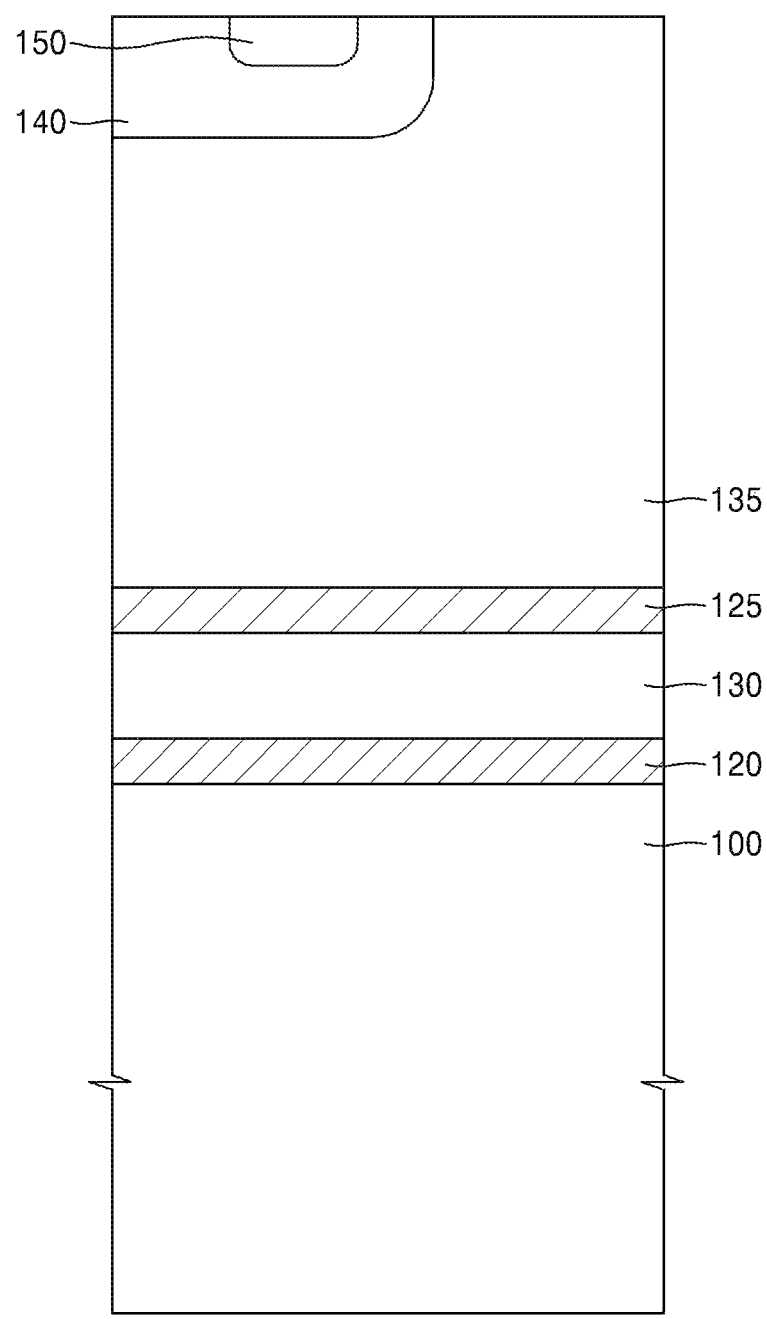

Referring to FIG. 9, the base region 140 is formed by selectively implanting impurity ions of a second conductivity type which is different from the first conductivity type (e.g., P-type) on a predetermined area of the upper surface of the drift region 130 and diffusing and/or activating the same. For example, the base region 140 may be a P-type high concentration ($P^+$) impurity region, and may form a P-N junction with the second drift region 135.

The emitter region 150 is formed by selectively ion-implanting the first conductivity type impurity ions (e.g., N-type impurity ions) on a predetermined area of the upper surface within the base region 140 and diffusing and/or activating the same. For example, the emitter region 150 may be an N-type high concentration ($N^+$) impurity region. At this time, the diffusion processes mentioned above may be performed during the heat treatment which is performed after implantation of the impurity ions.

Figure 10:
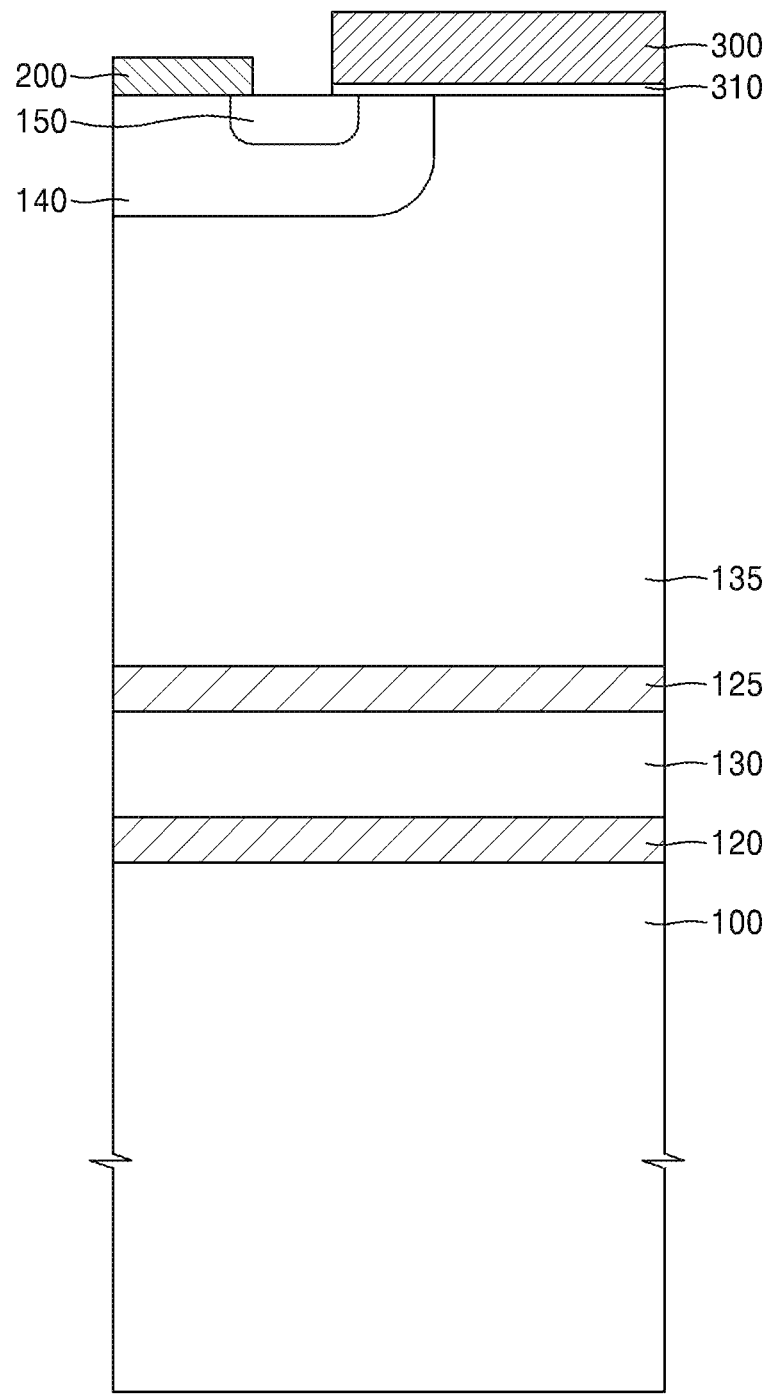

Referring to FIG. 10, after the emitter region 150 is formed, an emitter electrode 200 is formed, spanning the base region 140 and the emitter region 150 in contact therewith. Further, the gate insulating layer 310 is formed on the surface area of the second drift region 135, and a portion of the upper surface of the base region 140 and the emitter region 150, and a gate electrode 300 is formed on the gate insulating layer 310. The gate electrode 300 may set the portion of the base region 140 between the second drift region 135 and the emitter region 150 as a channel, by applying voltage.

Further, although not illustrated, after the emitter electrode 200 and the gate electrode 300 are formed, an insulating layer and/or a passivation layer may be additionally formed, covering the emitter electrode 200 and the gate electrode 300.

Figure 11:
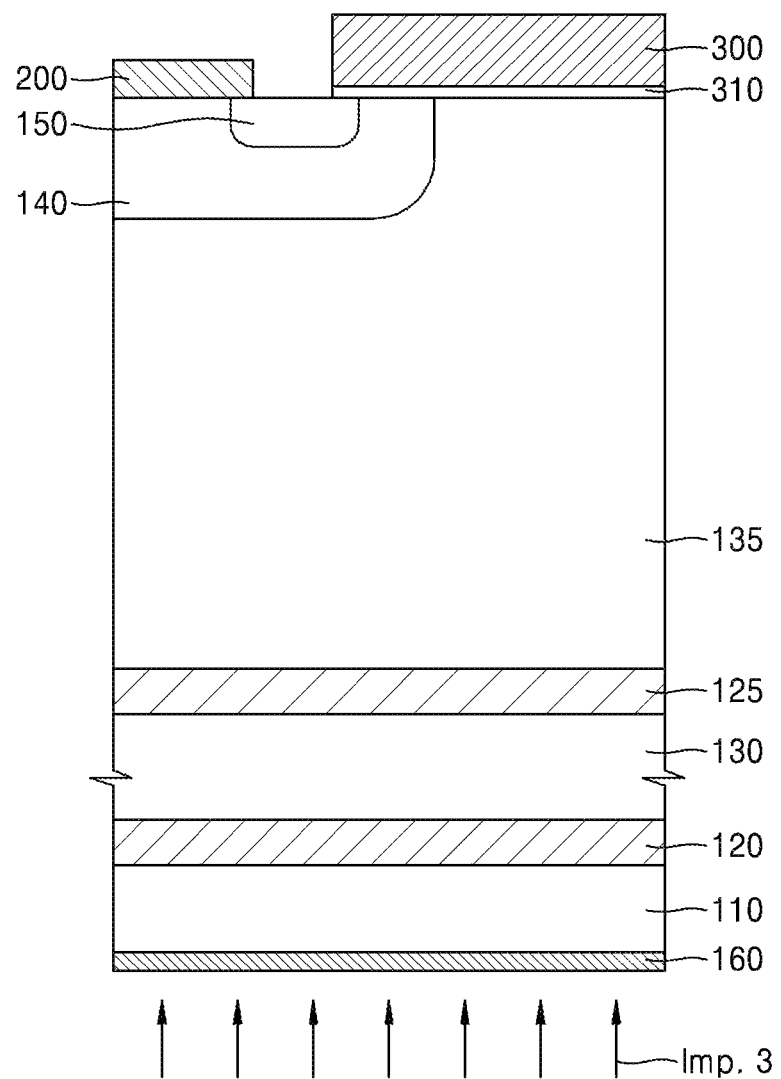

Referring to FIG. 11, the first field stop layer 110 is formed by removing a portion of the semiconductor substrate 100 of FIG. 10. That is, in the power device or in the FS-IGBT structure for example, while the first field stop layer 110 is substantially formed in a thickness that is relatively smaller than that of the first and second drift regions 130, 135, the semiconductor substrate 100 here is very thick. Accordingly, a process is performed to reduce the thickness of the back surface of the semiconductor substrate 100 by grinding. Meanwhile, since the collector region 160 will be formed below the first field stop layer 110, the remaining thickness of the semiconductor substrate 100 after grinding is set in consideration of the thickness of the collector region 160. For example, when the power device 1000a (FIG. 1) is set to a thickness of approximately 110 µm, for the remaining thickness after the grinding of the semiconductor substrate, i.e., for the thickness of the first field stop layer 110, approximately 5-15 µm may be considered. At this time, very small thickness, for example, approximately 0.3 to 1 µm may be considered for the collector region 160. Of course, the remaining thickness after grinding or the thickness of the collector region is not limited to those mentioned above.

The first field stop layer 110 is formed by grinding the back surface of the semiconductor substrate 100, in consideration of the remaining thickness. As described, since the first field stop layer 110 is formed by grinding the back surface of the semiconductor substrate 100, high energy ion implantation process for the field stop layer and associated annealing diffusion process can be omitted. Further, because the second field stop layer 120 by the ion implantation is already formed on the upper area of the semiconductor substrate, the first field stop layer 110 based on the semiconductor substrate may be formed into a thickness which is small enough.

Further, since the semiconductor substrate 100 maintains a sufficient thickness before the grinding process, the semiconductor substrate 100 can serve as a sufficient support substrate in the process of forming the base region 140, the emitter region 150, the emitter electrode 200 and the gate electrode 300, and the insulating layers formed thereafter. Accordingly, disadvantageous limitations in the processing involved with the use of thin substrate, such as substrate curling phenomenon, or limitations involved with the heating process which is employed to control such curling phenomenon, can be resolved.

Next, the collector region 160 is formed on a back surface of the first field stop layer 110 by ion-implanting (Imp. 3) impurity ions of a second conductivity type (e.g., P-type impurity ions) which is opposite to the first conductivity type on a grounded surface of the first field stop layer 110 and annealing to diffuse the same. At this time, the impurity concentration of the collector region 160 may be determined according to the switching-off characteristic of the device. For example, the collector region 160 may be a P-type high concentration ($P^+$) impurity region, and may be formed with a small thickness which may be 1 µm or below.

Next, the power device 1000a such as an FS-IGBT may be formed by forming the collector electrode 400 on the lower surface of the collector region 160, as illustrated in FIG. 1.

According to an embodiment of the present disclosure, because the buried region 125 is formed in the middle of forming the first drift region 130 and the second drift region 135 by the ion implantation process, the impurity concentration profile of the buried region 125 along the depth direction Z is in symmetry between the first drift region 130 and the second drift region 135, with reference to a portion that has the maximum impurity concentration. Accordingly, it is possible to form the first drift region 130 and the second drift region 135 in a relatively small thickness.

Figure 12:
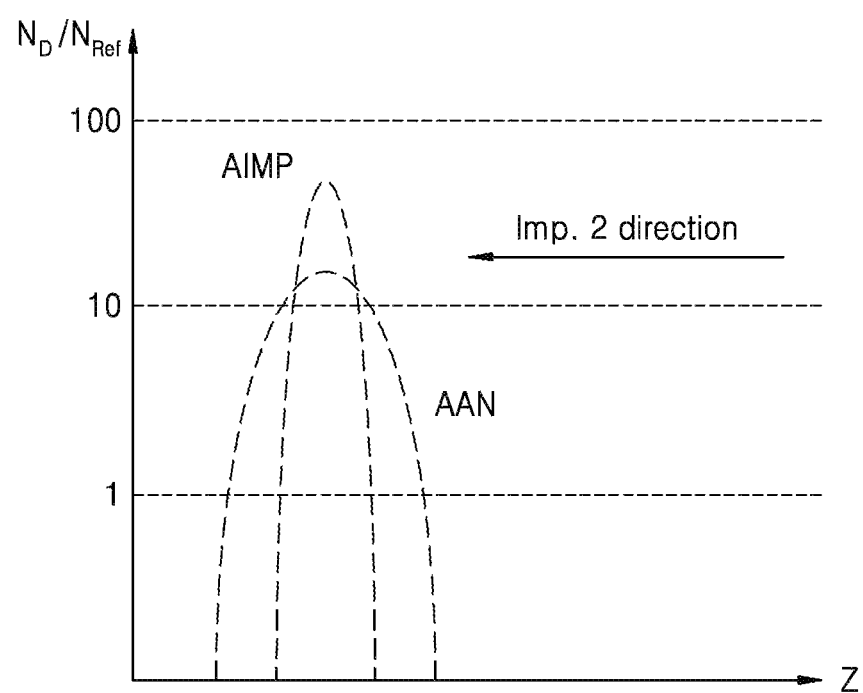
FIG. 12 is a graph representing comparison of profiles of impurity concentrations according to depths before and after heat treatment of buried region of a power device according to an embodiment of the present disclosure.

FIG. 12 is a graph representing comparison of profiles of impurity concentrations according to depths before and after heat treatment of buried region of a power device according to an embodiment of the present disclosure.

Referring to FIGS. 1 and 12 together, the buried region 125 of the power device 1000a according to the technical concept of the present disclosure includes a first region R1 having an increasing impurity concentration from the first drift region 130, and a second region R2 adjacent to the first region R1 and having a decreasing impurity concentration to the second drift region 135. The first region R1 and the second region R2 may have a symmetric shape of impurity concentration profile with reference to a maximum impurity concentration portion of the buried region 125. The impurity concentrations of the buried region 125 may be in symmetric shape both before (AIMP) and after (AAN) the heat treatment to activate the impurity ions.

If the ion implantation to form the buried region 125 is performed after the formation of the second drift region 135, due to detects generated in the second drift region 135 during the ion implantation process, the impurity concentration profile of the buried region 125 along the depth direction Z will have a tail shape which is relatively elongated toward the direction of the ion implantation, i.e., toward the second drift region 135. However, because the ion implantation to form the buried region 125 of the power device 1000a according to the technical concept of the present disclosure is performed before the second drift region is formed, no defects are generated in the second drift region 135. Accordingly, the buried region 125 may have an impurity concentration profile in which the first drift region 130 and the second drift region 135 are respectively in symmetric shape with reference to the portion that has the maximum impurity concentration.

Figure 13:
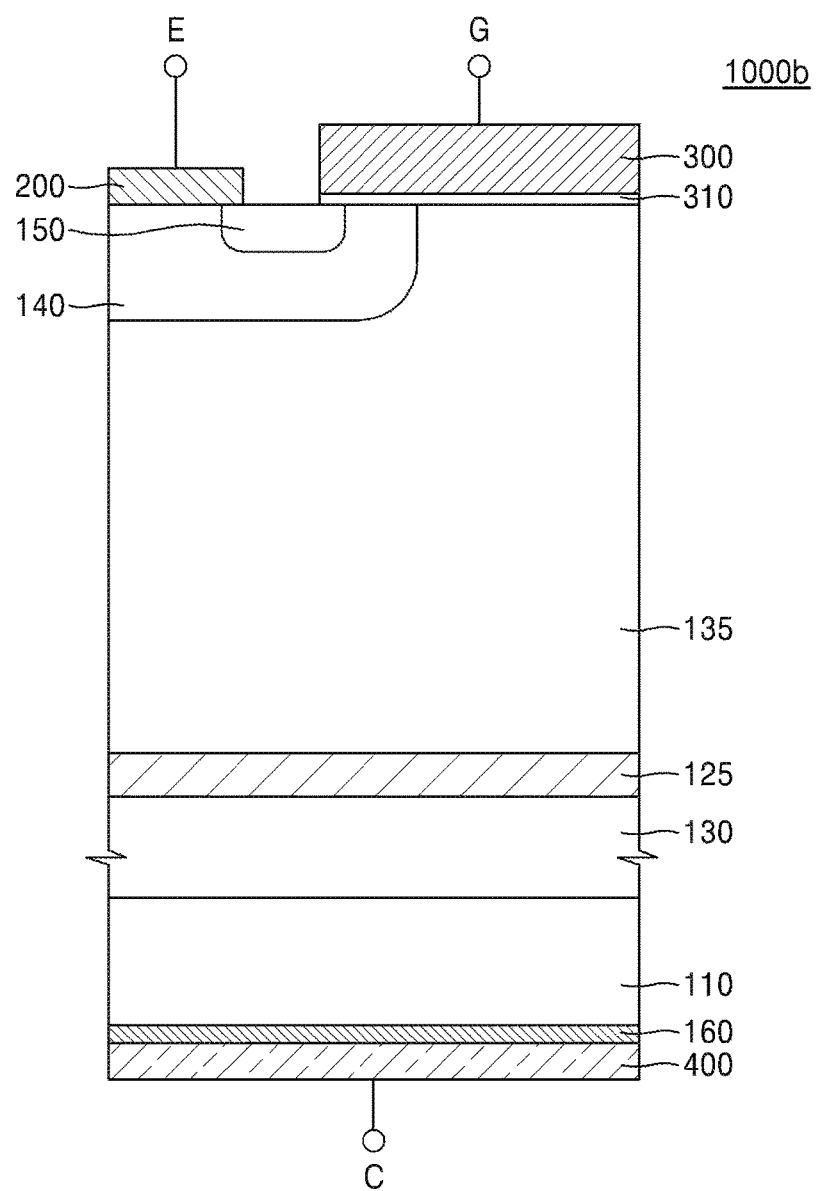
FIG. 13 is a cross sectional view of a power device according to an embodiment of the present disclosure.

FIG. 13 is a cross sectional view of a power device according to an embodiment of the present disclosure.

Referring to FIG. 13, the power device 1000b includes a first field stop layer 110, a first drift region 130, a buried region 125, a second drift region 135, a base region 140, and emitter region 150 and a collector region 160. The power device 1000b illustrated in FIG. 13 has the identical configuration as the power device 1000a illustrated in FIG. 1, except for a difference that the power device 1000b in FIG. 13 does not include the second field stop layer 120. Accordingly, redundant explanation about the elements or configurations overlapping with those of FIG. 1 will be omitted.

The buried region 125 may play a role of gathering the holes injected from the collector region 160 via the first field stop layer 110 to the first drift region 130, while also serving as a barrier that minimizes the flow of the holes to the second drift region 135. Accordingly, the power device 1000b illustrated in FIG. 13 may not include the second field stop layer 120 illustrated in FIG. 1 which may be selected according to the breakdown voltage and the driving current as required by the power device such as an FS-IGBT structure.

Figure 14:
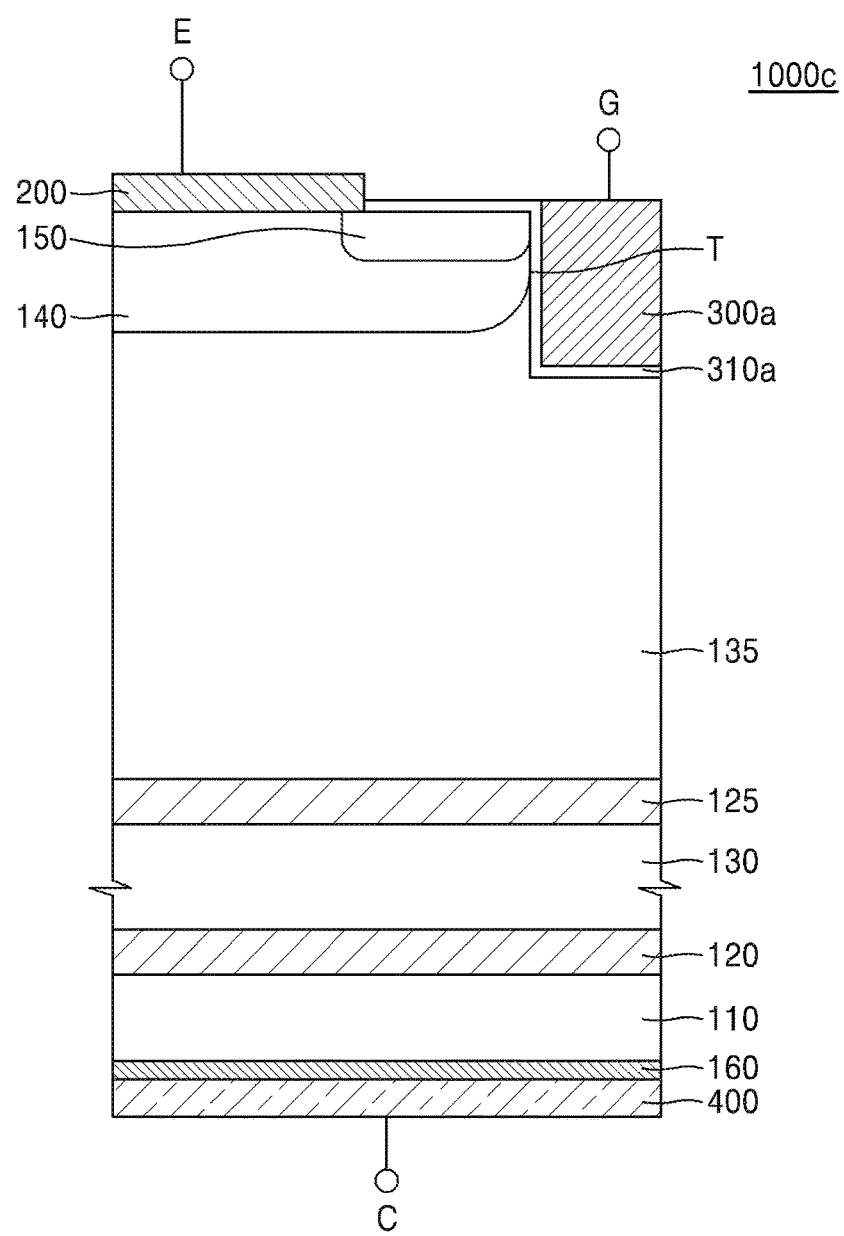
FIG. 14 is a cross sectional view of a power device according to an embodiment of the present disclosure.

FIG. 14 is a cross sectional view of a power device according to an embodiment of the present disclosure.

The power device 1000c illustrated in FIG. 14 has the identical configuration as the power device 1000a illustrated in FIG. 1, except for the differences in the base region 140, the emitter region 150, the gate electrode 300a and the gate insulating layer 310a. Accordingly, those that have already been described above with reference to FIG. 1 will not be explained or explained briefly for the sake of brevity.

Referring to FIG. 14, the power device 1000c may be formed in a trench-gate structure. A trench T having a receiving space therein is formed in an upper side of the second drift region 135, by digging in the surface of the second drift region 135 to a predetermined depth. The gate insulating layer 310a is formed to cover an inner surface of the trench T.

The trench T may be adjacent to one side surface of each of the base region 140 and the emitter region 150. The gate insulating layer 310a may be formed to partially cover the upper surface of the emitter region 150, but depending on embodiments, the gate insulating layer 310a may not be formed on the upper surface of the emitter region 150.

The gate electrode 300a is formed in the inner receiving space of the trench T having the gate insulating layer 310a formed therein. The upper surface of the gate electrode 300a may be in the same plane with the upper surface of the second drift region 135, but not limited thereto. The upper surface of the gate electrode 300a may be projected beyond the upper surface of the second drift region 135.

Meanwhile, as illustrated, the base region 140 and the emitter region 150 may be arranged adjacent to one sidewall of the trench T having the gate electrode 300a and the gate insulating layer 310a formed therein.

The example of the power device 1000c can reduce the area occupied by the gate electrode 300a compared to the example of the power device 1000b, because the gate electrode 300a is formed in the trench T.

FIGS. 15 to 18 are cross sectional views illustrating, in steps, a method for fabricating a power device according to an embodiment of the present disclosure. Specifically, FIGS. 15 to 18 are cross sectional views illustrating respective steps of a method for fabricating the power device 1000c illustrated in FIG. 14, in which the steps after FIG. 8 are illustrated. Herein, steps that may overlap with those in FIGS. 4 to 11 may be omitted from the illustration. In other words at least some of the processing associated with FIGS. 4 to 11 can be used for the processing of the power device 1000c shown in FIG. 14.

Figure 15:
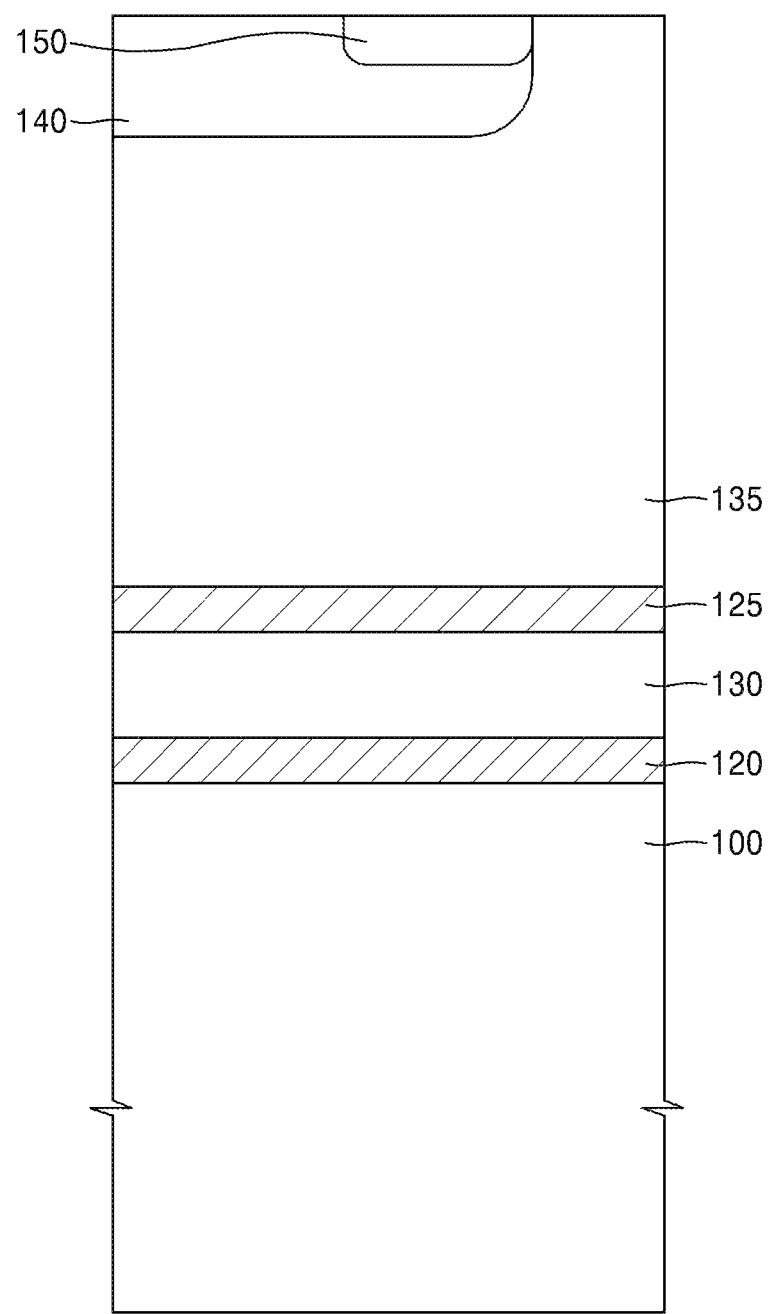
FIGS. 15 to 18 are cross sectional views illustrating a method for fabricating a power device according to an embodiment of the present disclosure.

Referring to FIG. 15, the second field stop layer 120, the first drift region 130, the buried region 125, the second drift region 135, the base region 140 and the emitter region 150 are formed on the semiconductor substrate 100. The area of the second drift region 135 that is exposed between the adjacent base region 140 and emitter region 150 may be narrower than the area of the second drift region 135 illustrated in FIG. 9 as exposed between the base region 140 and the emitter region 150. Except for the above, the second field stop layer 120, the first drift region 130, the buried region 125, the second drift region 135, the base region 140 and the emitter region 150 are formed by the same method as that explained above with reference to FIGS. 4 to 9.

Figure 16:
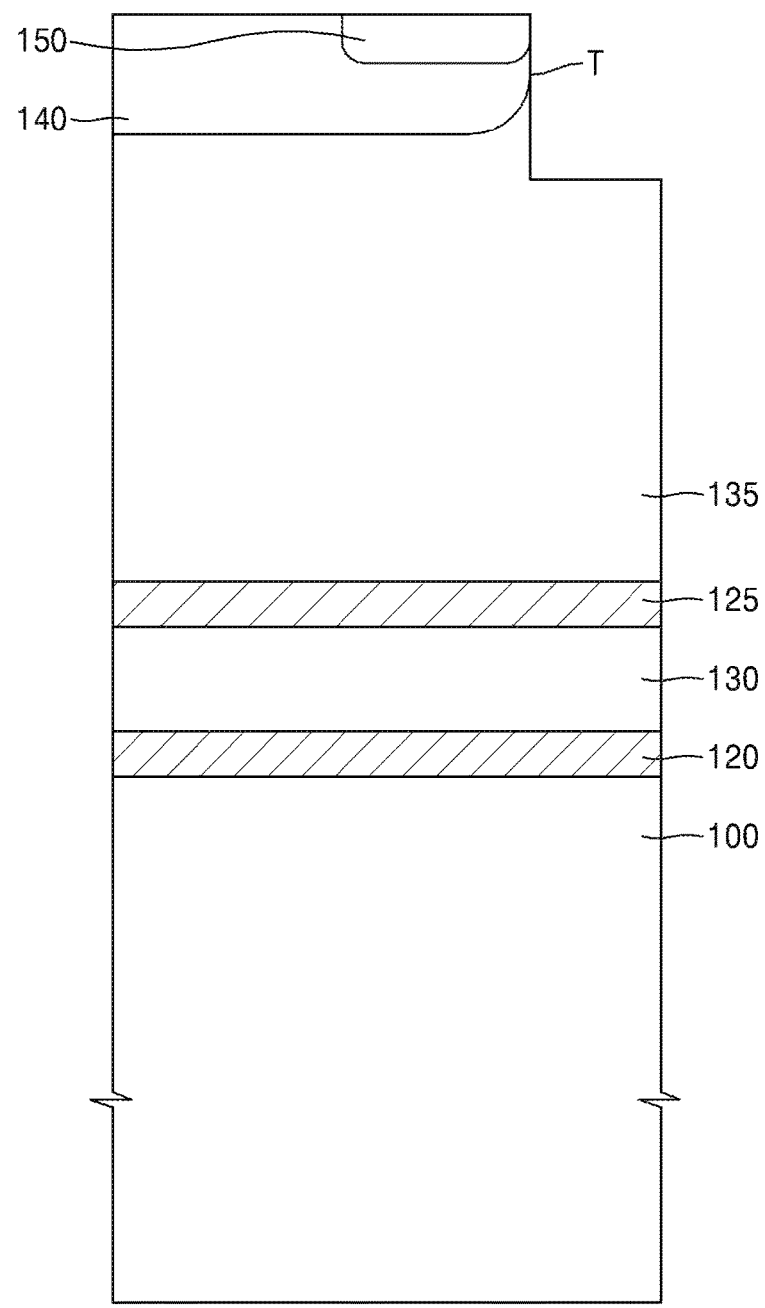

Referring to FIG. 16, a trench T having a receiving space therein is formed in an upper side of the second drift region 135, by digging in the surface of the second drift region 135 to a predetermined depth. The trench T may be formed by photo-lithography and etching process. The trench T has a sidewall that is adjacent to one side surface of each of the base region 140 and the emitter region 150.

Figure 17:
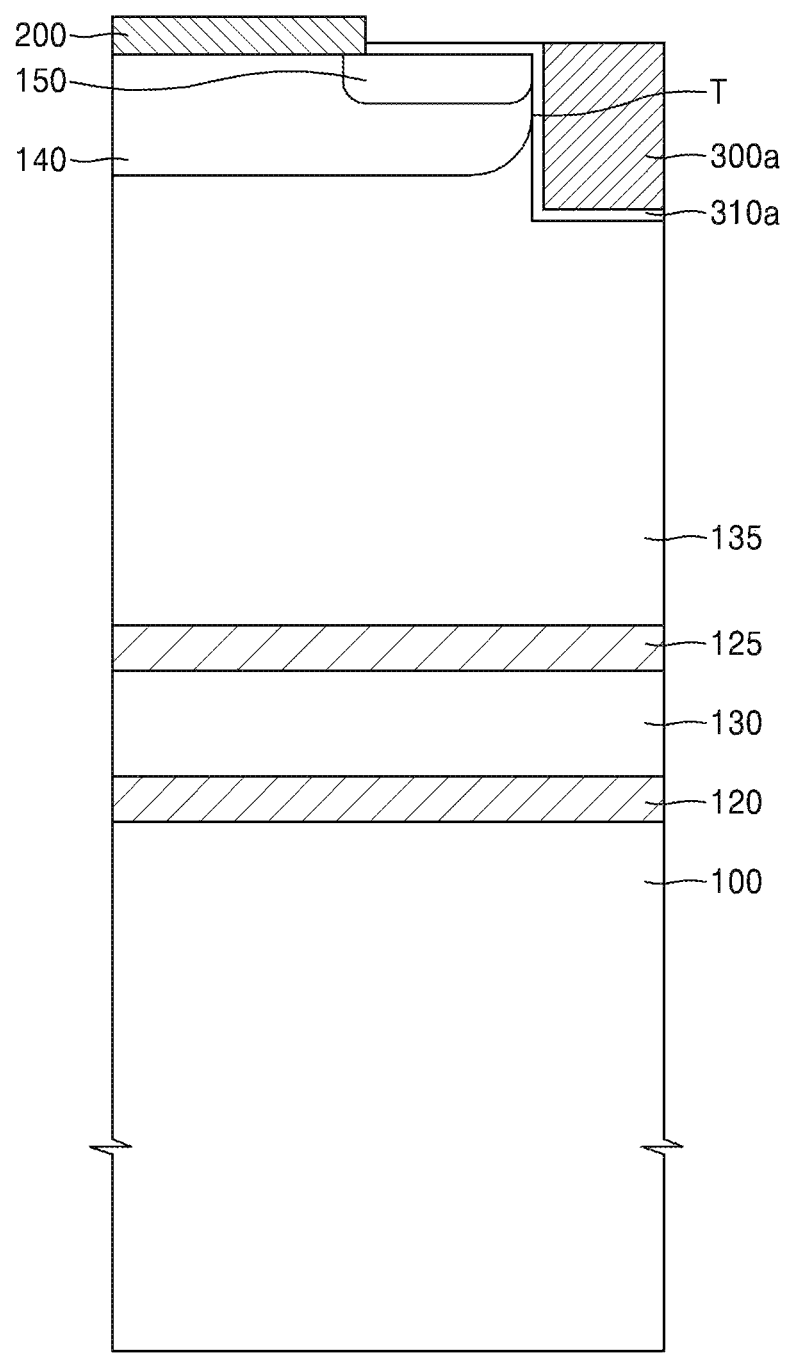

Referring to FIG. 17, the gate insulating layer 310a is formed, covering an inner surface of the trench T. Next, the gate electrode 300a is formed in the inner receiving space of the trench T which has the gate insulating layer 310a formed therein. Further, the emitter electrode 200 is formed, which spans the base region 140 and the emitter region 150 in contact therewith.

Although FIG. 17 illustrates the gate insulating layer 310a covering the upper surface of the emitter region 150, depending on embodiments, the gate insulating layer 310a may not be formed on the upper surface of the emitter region 150. As illustrated in FIG. 17, an upper end of the gate electrode 300a may be in the same plane with the upper surface of the drift region 130, or although not illustrated, may be projected beyond (or above) the upper surface of the drift region 130.

Figure 18:
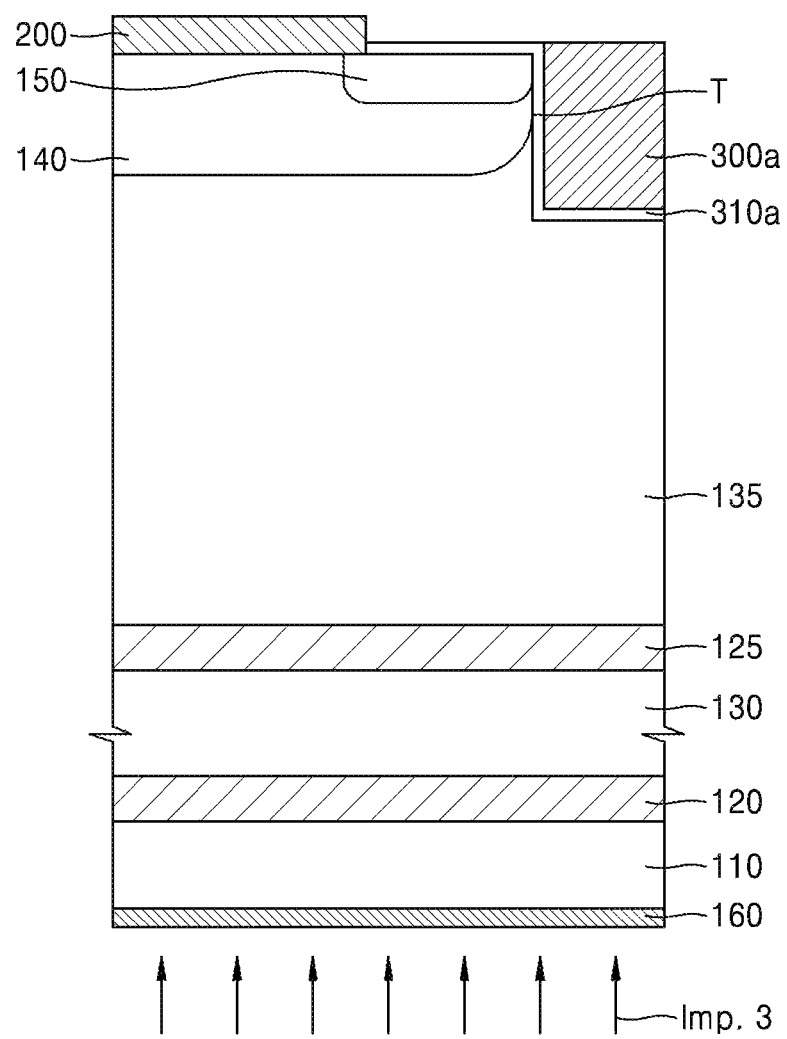

Referring to FIG. 18, the first field stop layer 110 is formed by removing a portion of the semiconductor substrate 100 of FIG. 17. Next, the collector region 160 is formed on a back surface of the first field stop layer 110 by ion-implanting (Imp. 3) the impurity ions of a second conductivity type which is opposite to the first conductivity type on the lower surface of the first field stop layer 110, and annealing to diffuse the same.

Figure 19:
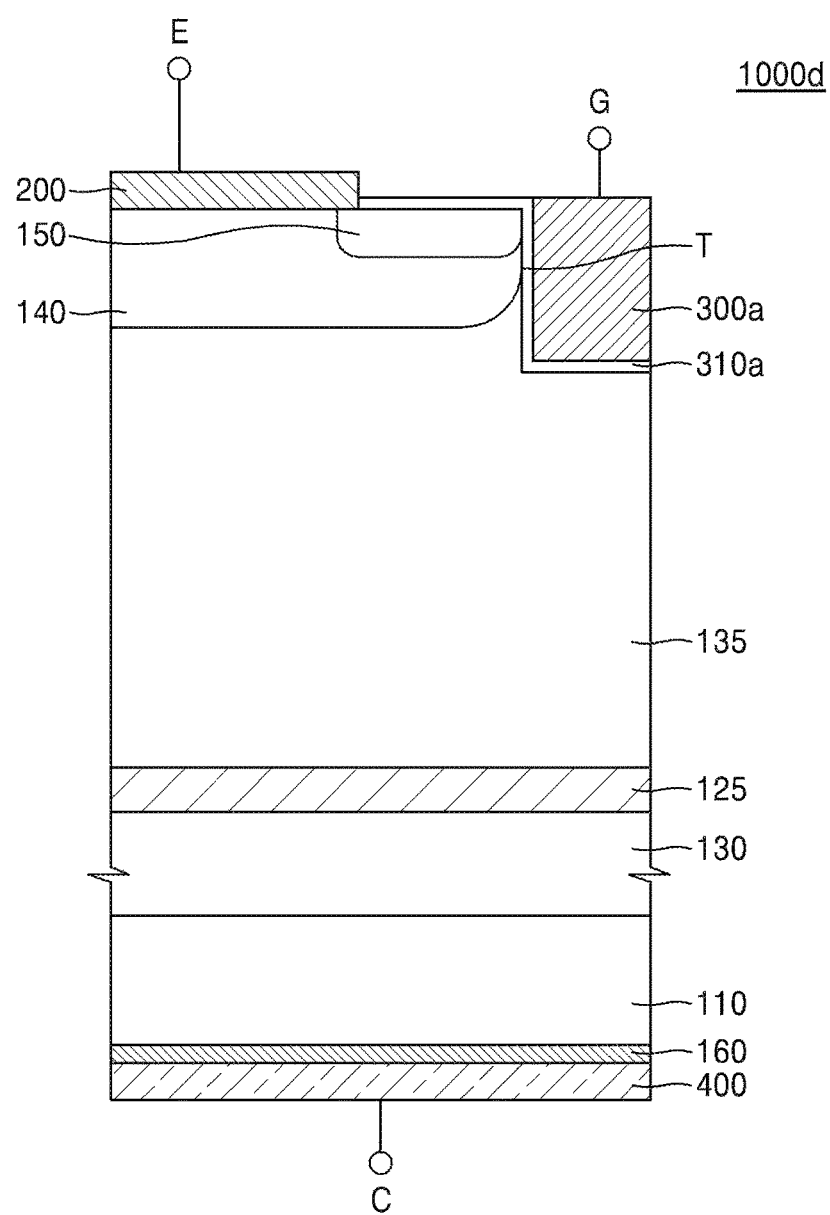
FIG. 19 is a cross sectional view of a power device according to an embodiment of the present disclosure.

FIG. 19 is a cross sectional view of a power device according to an embodiment of the present disclosure.

Referring to FIG. 19, the power device 1000d has the identical configuration as the power device 1000c illustrated in FIG. 14, except for a difference that the power device 1000d does not include the second field stop layer 120. Accordingly, redundant explanation about the elements or configurations overlapped with those already explained above will be omitted for the sake of brevity.

Figure 20:
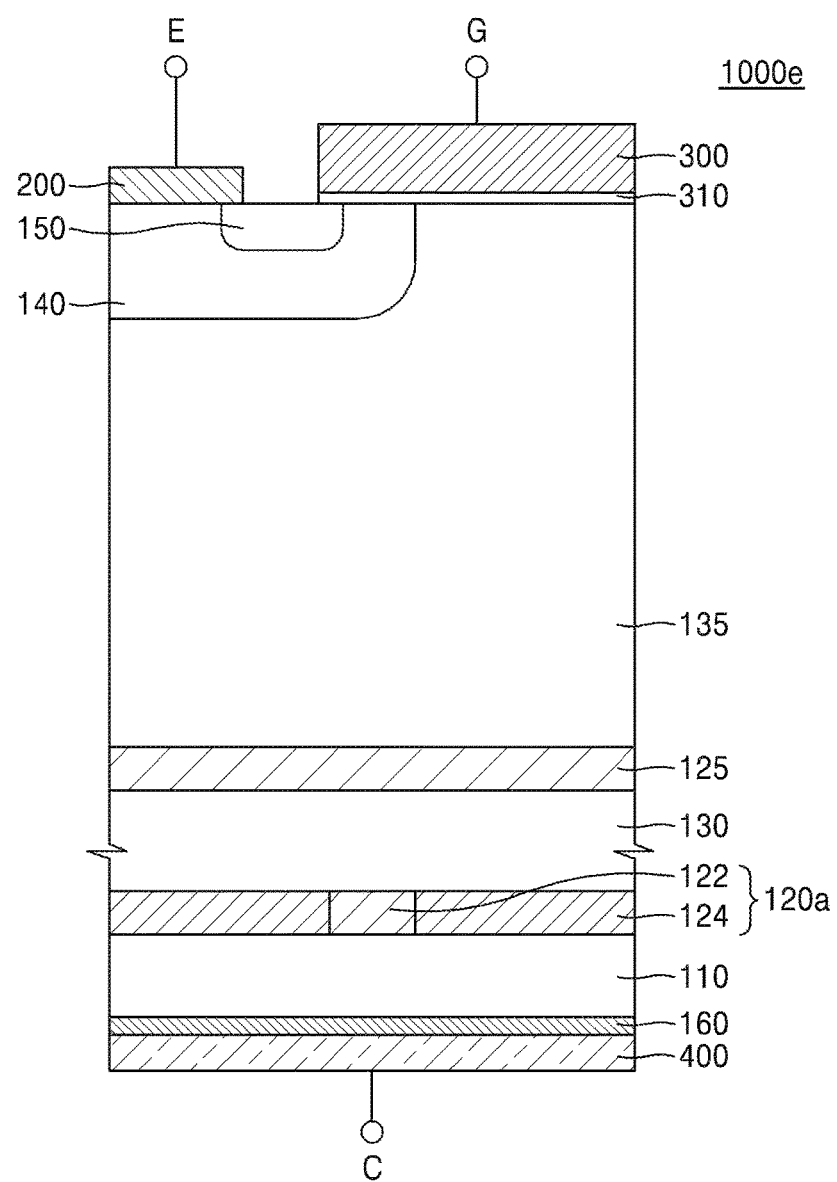
FIG. 20 is a cross sectional view of a power device according to an embodiment of the present disclosure.

FIG. 20 is a cross sectional view of a power device according to an embodiment of the present disclosure.

Referring to FIG. 20, the power device 1000e includes the first field stop layer 110, the first drift region 130, the buried region 125, the second drift region 135, the base region 140, the emitter region 150 and the collector region 160. The power device 1000e may additionally include the second field stop layer 120a. The power device 1000e illustrated in FIG. 20 has the identical configuration as the power device 1000a illustrated in FIG. 1, except for the second field stop layer 120a. Accordingly, redundant explanation about the elements or configurations overlapped with those already explained above will be omitted for the sake of brevity.

The second field stop layer 120a may include a first region 122 and a second region 124. A portion of the second field stop layer 120a may be the first region 122, and the rest portion of the second field stop layer 120a excluding the first region 122 may be the second region 124. The first region 122 and the second region 124 of the second field stop layer 120a may be in contact with each other. That is, the first region 122 and the second region 124 of the second field stop layer 120a may form a high-low junction.

The second region 124 of the second field stop layer 120a may have a higher impurity concentration than the first region 122. The second region 124 of the second field stop layer 120a may have a higher impurity concentration than the first region 122 on a same level, i.e., on a same level in a height direction. The first region 122 of the second field stop layer 120a may have a first impurity concentration, and the second region 124 of the second field stop layer 120a may have a second impurity concentration which is higher than the first impurity concentration.

After the first ion implantation process in which the impurity ions of the first conductivity type are ion-implanted into the second field stop layer 120a to form a first impurity concentration, a partial, additional ion implantation process is performed with respect to the second region 124, in which the impurity ions of the first conductivity type are additionally ion-implanted to form a second impurity concentration. Accordingly, the average impurity concentration of the second region 124 may be higher than the average impurity concentration of the first region 122.

Meanwhile, the fast switching can be enabled, since the second region 124 of the second field stop layer 120a can reduce the current tail of the holes during turn-off switching of the power device.

As illustrated in FIG. 20, the second region 124 of the second field stop layer 120a may be disposed in the middle of the power device 1000e in a horizontal direction, but embodiments are not limited herein. Accordingly, the second region 124 may be formed at a region of the power device 1000e which needs to minimize the injection of the holes, and the amount of holes being injected may be adjusted depending on regions.

The first region 122 and the second region 124 of the second field stop layer 120a may each have a higher impurity concentration portion than the first field stop layer 110. The impurity concentrations of the first region 122 and the second region 124 of the second field stop layer 120a may each have a varying impurity concentration depending on depths.

Figure 21:
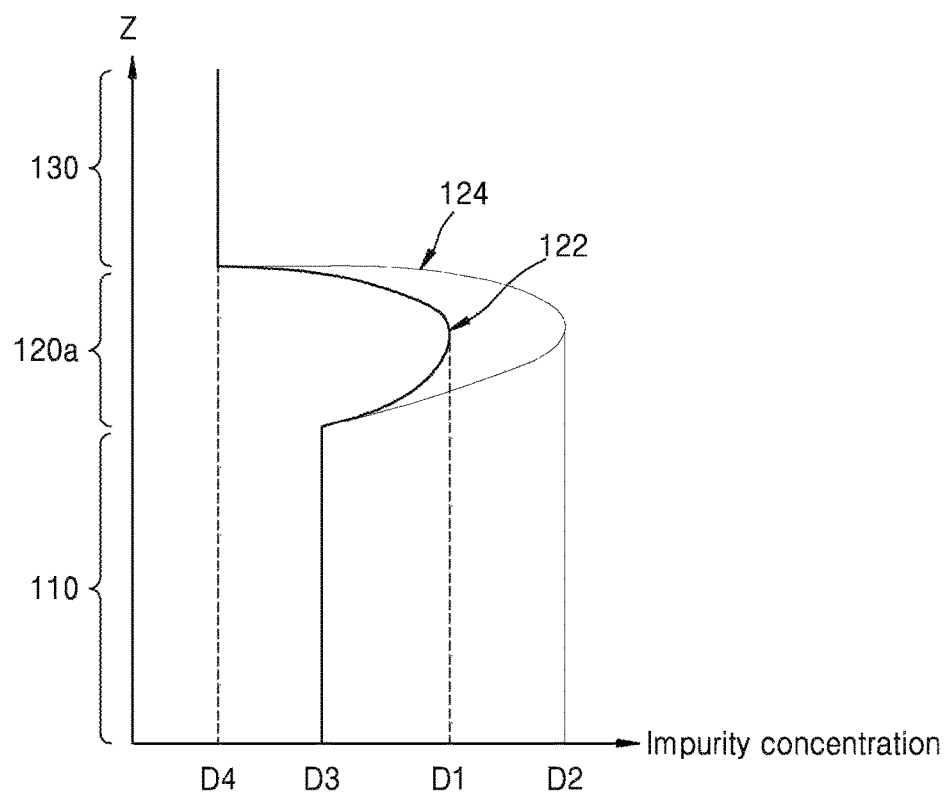
FIG. 21 is a graph representing a profile of impurity concentration of a second field stop layer of a power device, according to an embodiment of the present disclosure.

FIG. 21 is a graph representing a profile of impurity concentration of a second field stop layer of a power device, according to an embodiment of the present disclosure.

Referring to FIG. 21, the impurity concentration profiles of the second field stop layer 120a in the depth direction Z are illustrated, each crossing the first region 122 and the second region 124, respectively. The first impurity concentration as the impurity concentration of the first region 122 may have a smaller value than the second impurity concentration as the impurity concentration of the second region 124. While the impurity concentration of each of the first region 122 and the second region 124 may have a constant value on the same level, there may be a section where the impurity concentration varies from the second impurity concentration to the first impurity concentration due to diffusion at the boundary between the first region 122 and the second region 124. The first region 122 may have a first maximum impurity concentration D1, and the second region 124 may have a second maximum impurity concentration D2 which is greater than the first maximum impurity concentration D1.

The first drift region 130 may have a constant impurity concentration D4 along the depth direction Z. Of course, as it has been described above, the first drift region 130 may be so formed as to have changing impurity concentration depending on depths. The first field stop layer 110 based on the semiconductor substrate may have a constant impurity concentration D3 according to depths.

The impurity concentration of the first region 122 gradually increases from the impurity concentration D4 of the first drift region 130 up to the first maximum impurity concentration D1, and then decreases (e.g., gradually decreases) to reach the impurity concentration D3 of the first field stop layer 110.

The trend of the impurity concentration profile of the second region 124 with respect to the depth direction Z is almost similar to the trend of the impurity concentration profile of the first region 122 with respect to the depth direction Z.

The impurity concentration of the second region 124 gradually increases from the impurity concentration D4 of the first drift region 130 up to the second maximum impurity concentration D2, and then gradually decreases to reach the impurity concentration D3 of the first field stop layer 110.

FIGS. 22 to 25 are cross sectional views illustrating, in steps, a method for fabricating a power device according to an embodiment of the present disclosure.

Figure 22:
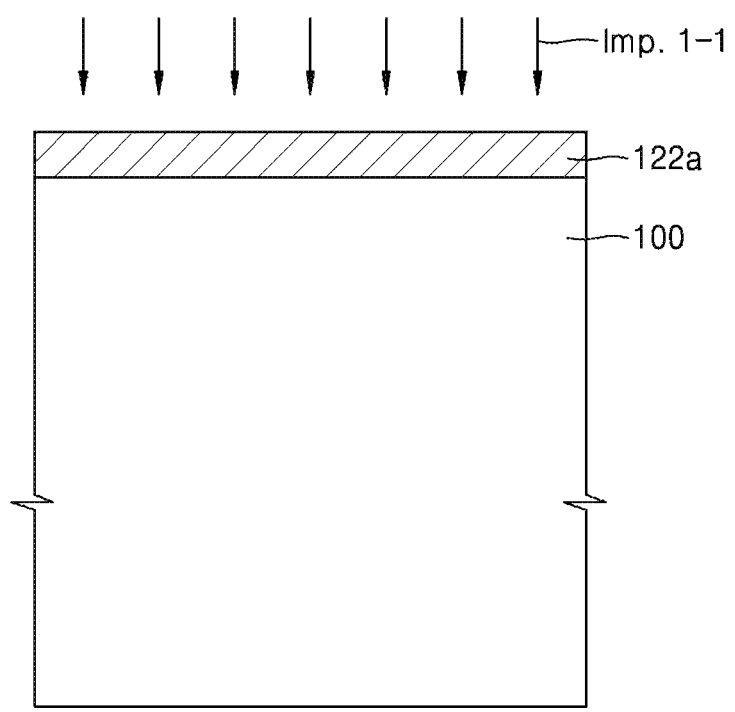
FIGS. 22 to 25 are cross sectional views illustrating a method for fabricating a power device according to an embodiment of the present disclosure.

Referring to FIG. 22, an implanted layer 122a is formed by performing a first ion implantation process (Imp. 1) of ion-implanting the impurity ions of the first conductivity type on the upper area of the semiconductor substrate 100. The impurity concentration of the implanted layer 122a may vary depending on the depth direction, and may include an impurity concentration portion of $1E^{15}$ to $1E^{17}/cm^3$. The implanted layer 122a may be formed into a small thickness and may be approximately several μm thick. Depending on cases, the thickness may be approximately several tens of μm.

Figure 23:
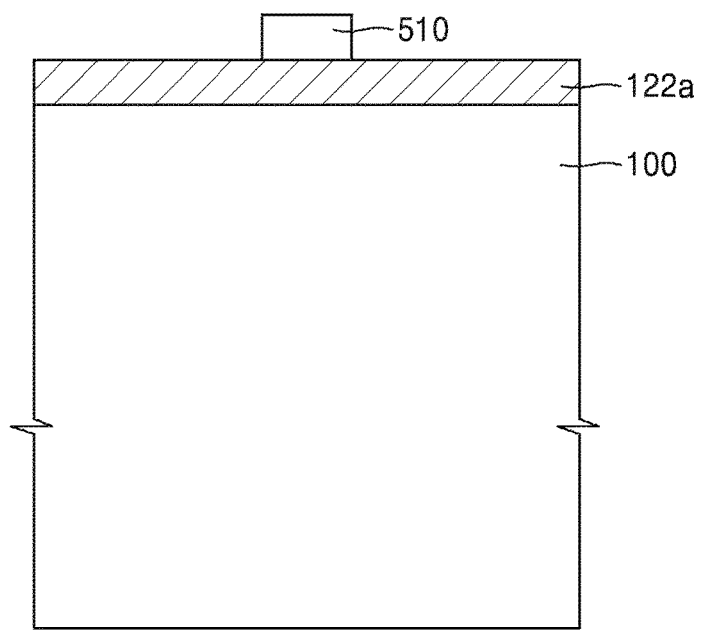

Referring to FIG. 23, a photoresist layer 510 is formed on the implanted layer 122a, while partially covering the implanted layer 122a. The photoresist layer 510 may be formed by photo-lithography process. The area of the implanted layer 122a that is covered by the photoresist layer 510 may be the first region 122 illustrated in FIG. 20.

Figure 24:
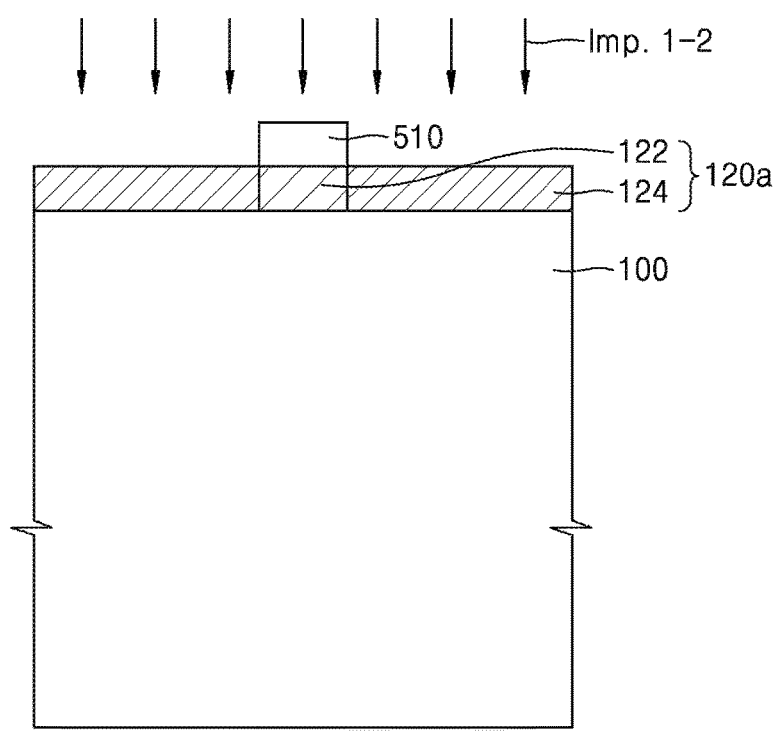

Referring to FIG. 24, using the photoresist layer 510 as a mask, the second region 124 is formed by performing partial additional ion implantation process (Imp. 1-2) of ion-implanting the impurity ions having the first conductivity type on the portion of the implanted layer 122a that is exposed by the photoresist layer 510 as illustrated in FIG. 23. At this time, the portion of the implanted layer 122a in FIG. 23, which is covered by the photoresist layer 510, is the first region 122.

Figure 25:
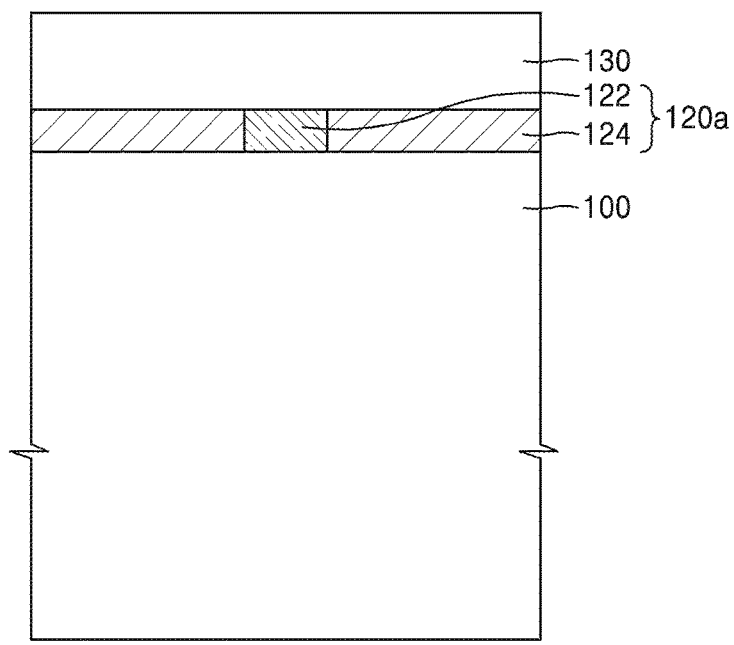

Referring to FIG. 25, after the partial additional ion implantation process (Imp. 1-2) illustrated in FIG. 24, the photoresist layer 510 may be removed by strip process.

Referring to FIGS. 23 to 25 together, by the first ion implantation process (Imp. 1) and partial additional ion implantation process (Imp. 1-2), the first region 122 and the second region 124 of the second field stop layer 120a may be formed. The first ion implantation process (Imp. 1) causes the first conductivity type impurities to be implanted into the first region 122, and the first ion implantation process (Imp. 1) and partial additional ion implantation process (Imp. 1-2) together may cause the first conductivity type impurities to be implanted into the second region 124. Accordingly, the impurity concentration of the second region 124 may be higher than the impurity concentration of the first region 122.

In forming the second field stop layer 120a, diffusion and/or activation process may be performed by heat treatment. Depending on examples, the diffusion process may be omitted. Further, the diffusion and/or activation process by the heat treatment may be performed after the first ion implantation process (Imp. 1) and after the partial additional ion implantation process (Imp. 1-2), or alternatively, only after the partial additional ion implantation process (Imp. 1-2).

Figure 26:
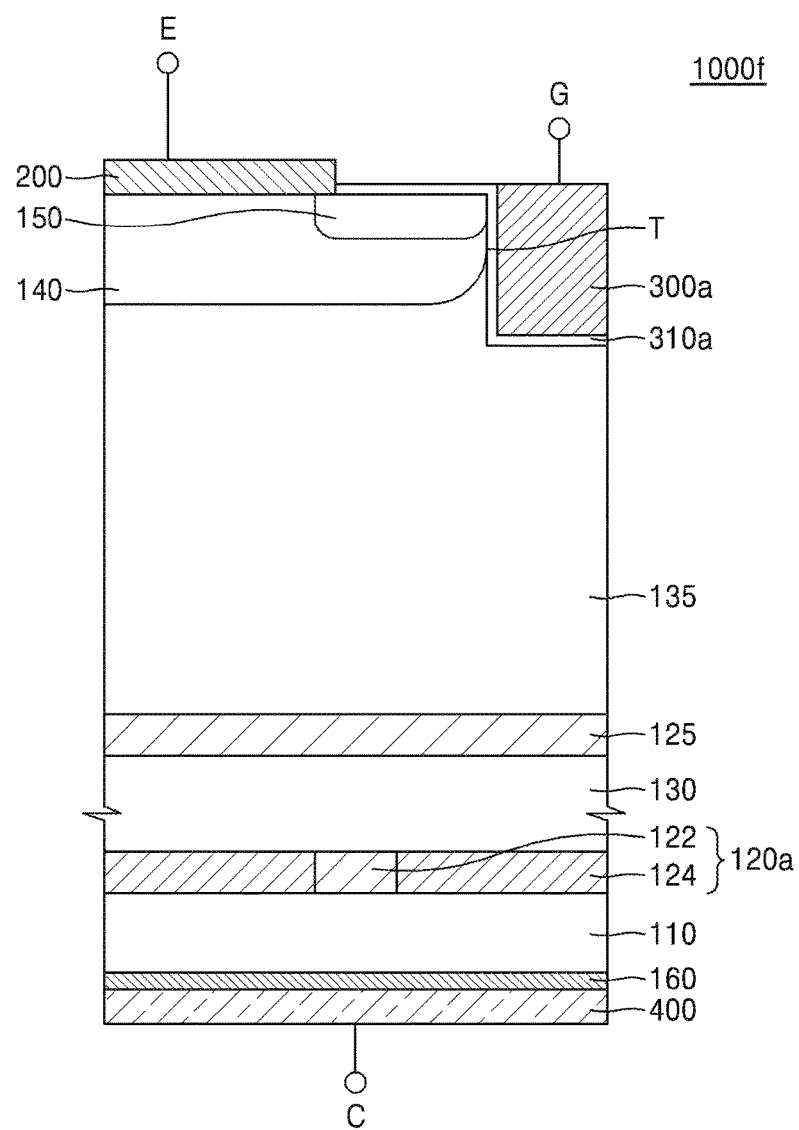
FIG. 26 is a cross sectional view of a power device according to an embodiment of the present disclosure.

FIG. 26 is a cross sectional view of a power device according to an embodiment of the present disclosure.

Referring to FIG. 26, the power device 1000f is an example in which the second field stop layer 120a of the power device 1000e illustrated in FIG. 20 is applied instead of the second field stop layer 120 of the power device 1000c illustrated in FIG. 14. Since the example can be realized based on the description provided above with reference to FIGS. 14 and 26, further detailed description will be omitted for the sake of brevity. That is, the power device 1000f may be formed by the methods described above with reference to FIG. 4, FIGS. 6 to 8, FIGS. 15 to 18, and FIGS. 22 to 25.

Figure 27:
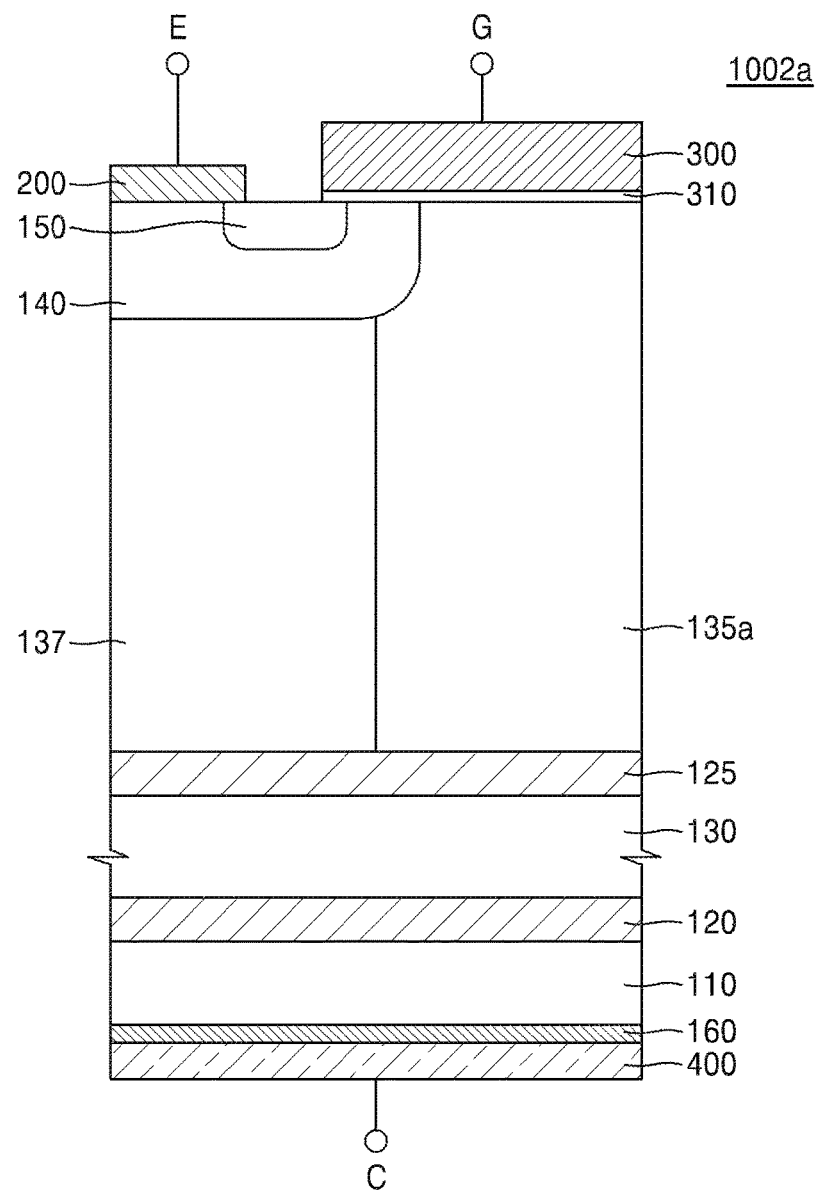
FIG. 27 is a cross sectional view of a power device according to an embodiment of the present disclosure.

FIG. 27 is a cross sectional view of a power device according to an embodiment of the present disclosure.

Referring to FIG. 27, instead of the second drift layer 135 of the power device 1000c illustrated in FIG. 1, the power device 1002a applies a first conductivity type pillar layer 135a and a second conductivity type pillar layer 137. In the following description, those that have already been explained above with reference to FIG. 1 will not be additionally explained or explained only briefly.

The power device 1002a includes the first conductivity type pillar layer 135a and the second conductivity type pillar layer 137 formed on the buried region 125. The base region 140 may be formed on a portion of an upper surface of the first conductivity type pillar layer 135a and the second conductivity type pillar layer 137.

The first conductivity type pillar layer 135a and the second conductivity type pillar layer 137 may be the impurity region of the first conductivity type and the impurities of the second conductivity type which are perpendicularly extended on the buried region 125, respectively. The first conductivity type pillar layer 135a and the second conductivity type pillar layer 137 include super junction structures which are alternately arranged on the buried region 125 in a horizontal direction. During turn-on switching of the power device 1002a, the first conductivity type pillar layer 135a provides a conductive path for the electric charges that flows from the emitter electrode 200 to the collector electrode 400. That is, the first conductivity type pillar layer 135a may perform a function of the second drift region 135 as illustrated in FIG. 1. During turn-off switching of the power device 1002a, the first conductivity type pillar layer 135a and the second conductivity type pillar layer 137 are depleted with each other by the reverse bias, and thus can have sufficiently high breakdown voltage characteristic. In particular, when the amounts of electric charges are in balance with each other between the first conductivity type pillar layer 135a and the second conductivity type pillar layer 137, the first conductivity type pillar layer 135a and the second conductivity type pillar layer 137 are completely depleted in the turn-off state, thus serving as an ideal insulator.

Figure 28:
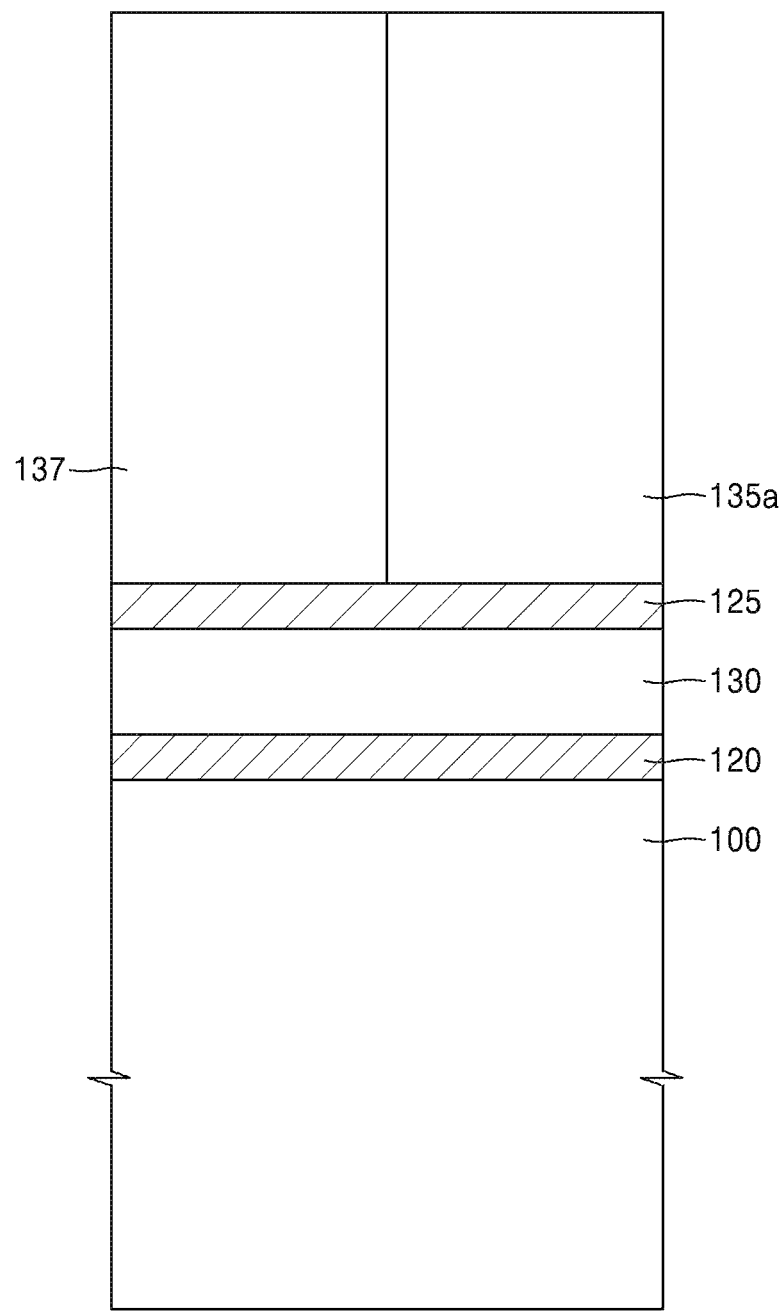
FIG. 28 is a cross sectional view illustrating a method for fabricating a power device according to an embodiment of the present disclosure.
Figure 29:
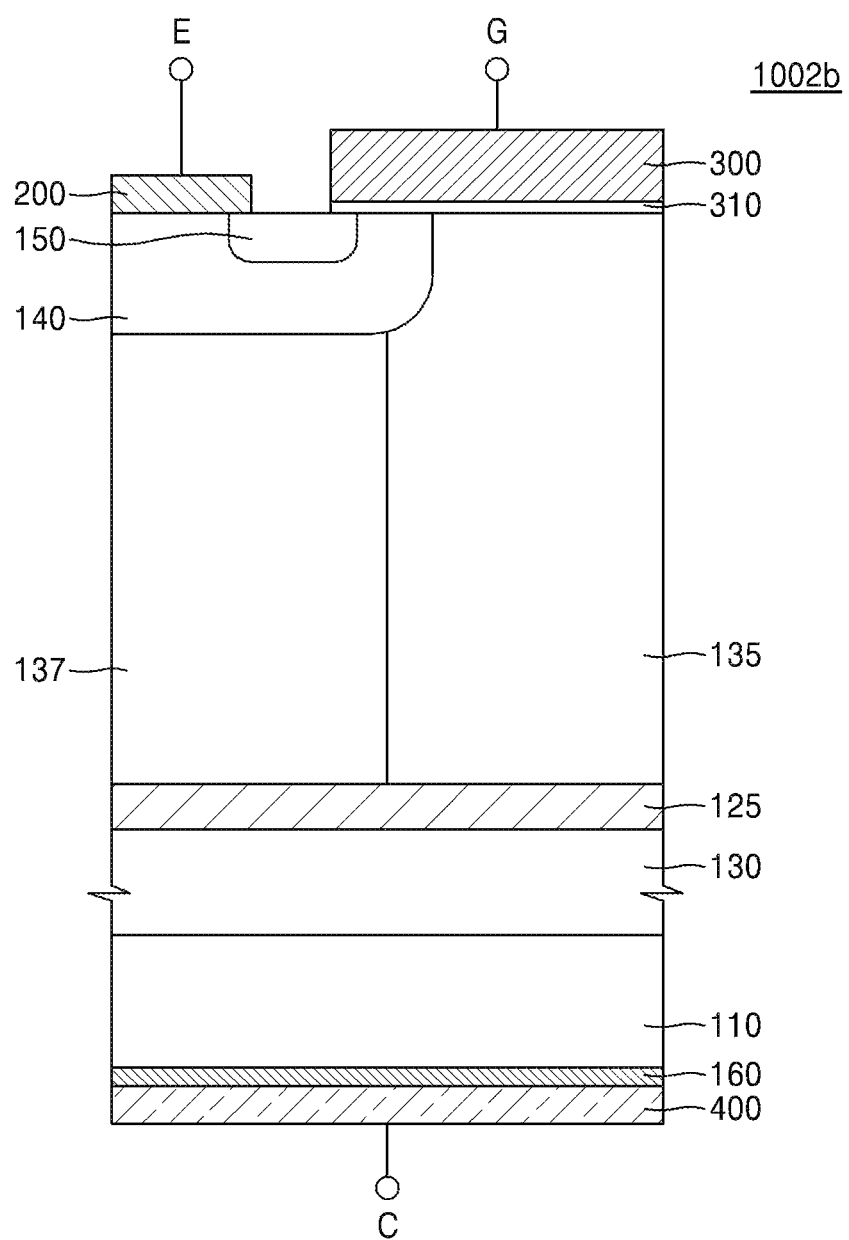
FIGS. 29 to 33 are cross sectional views of power devices according to an embodiment of the present disclosure.
Figure 30:
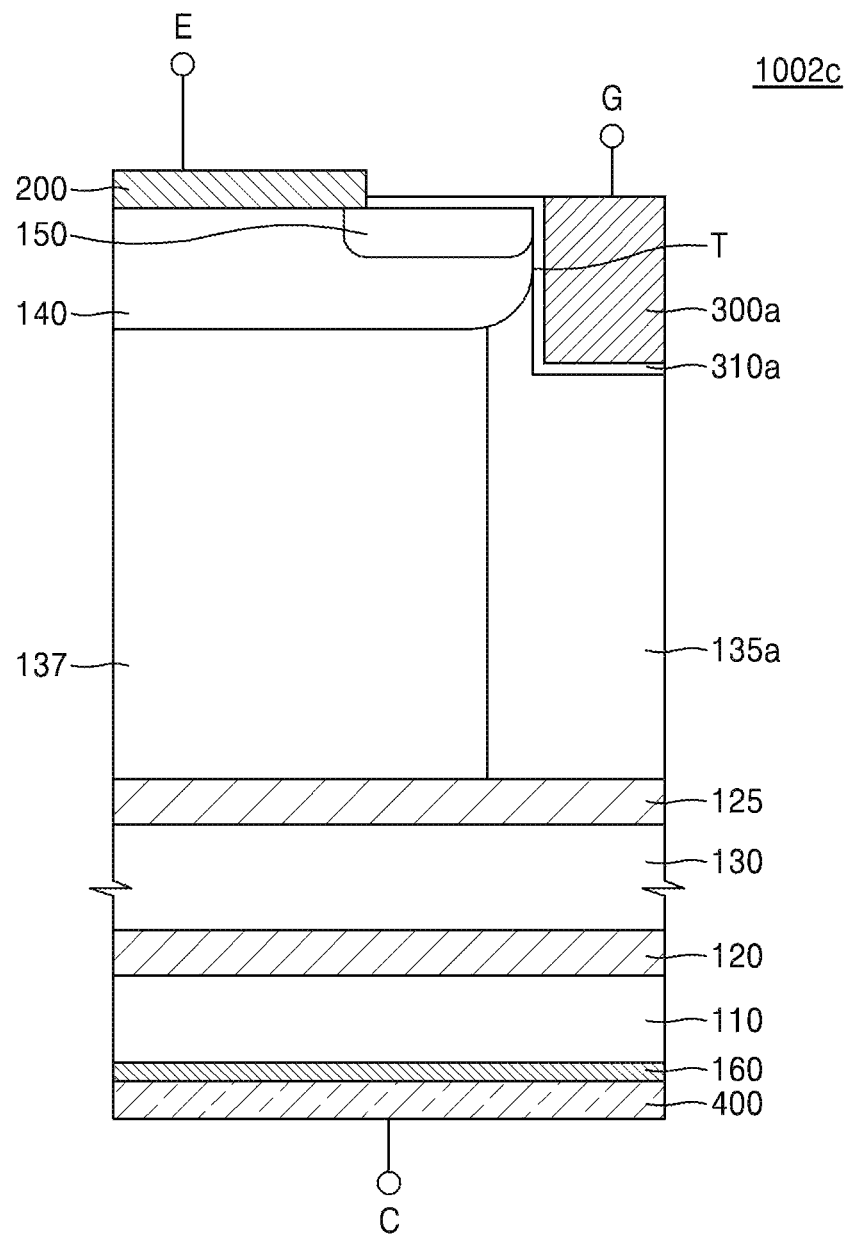
Figure 31:
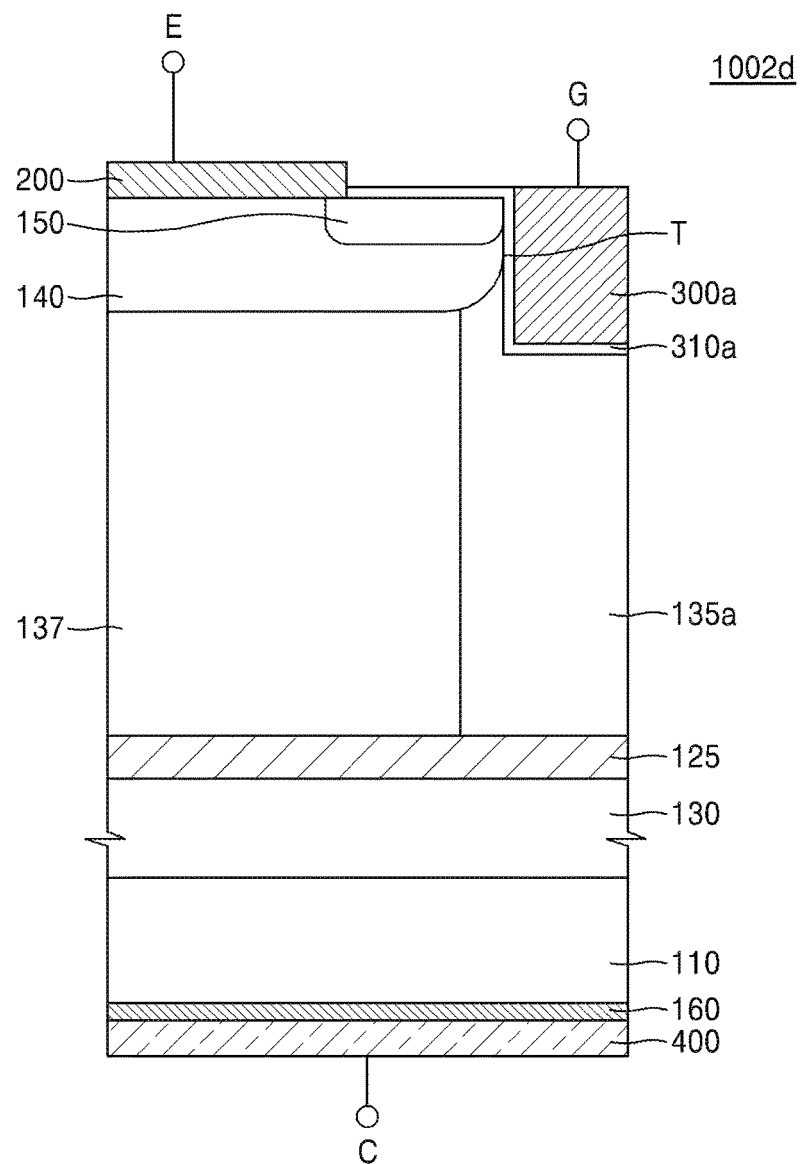
Figure 32:
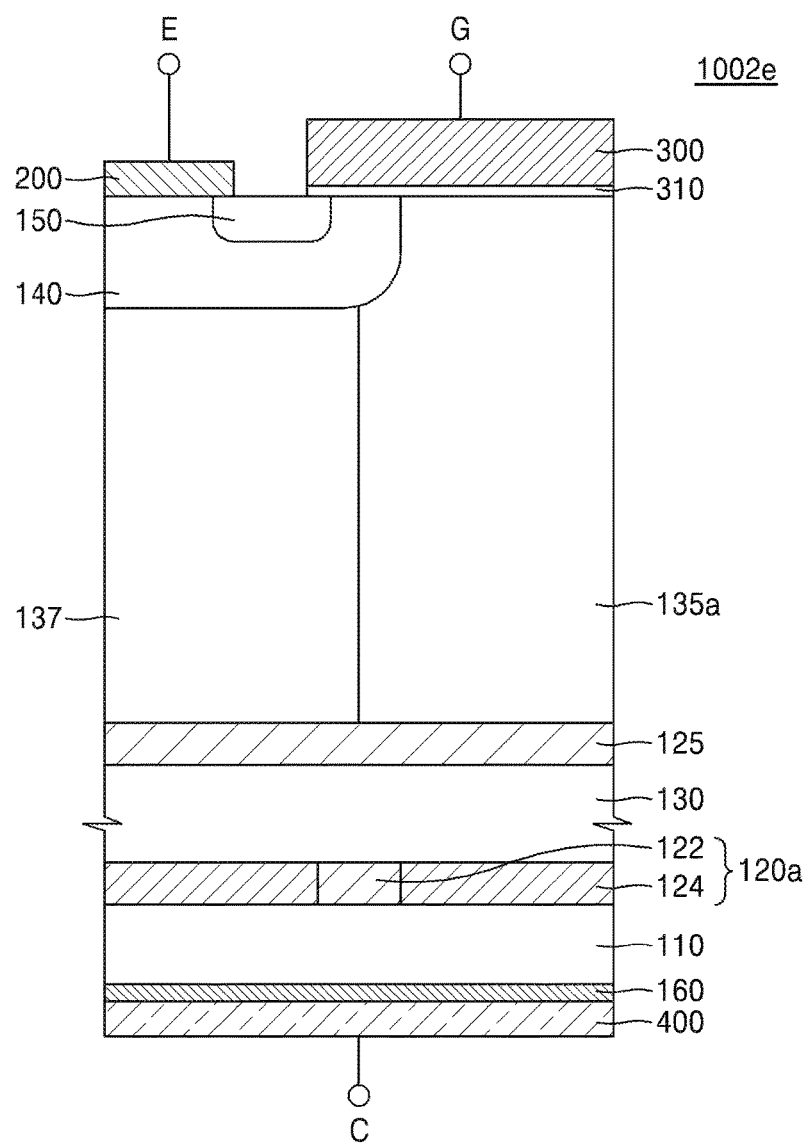
Figure 33:
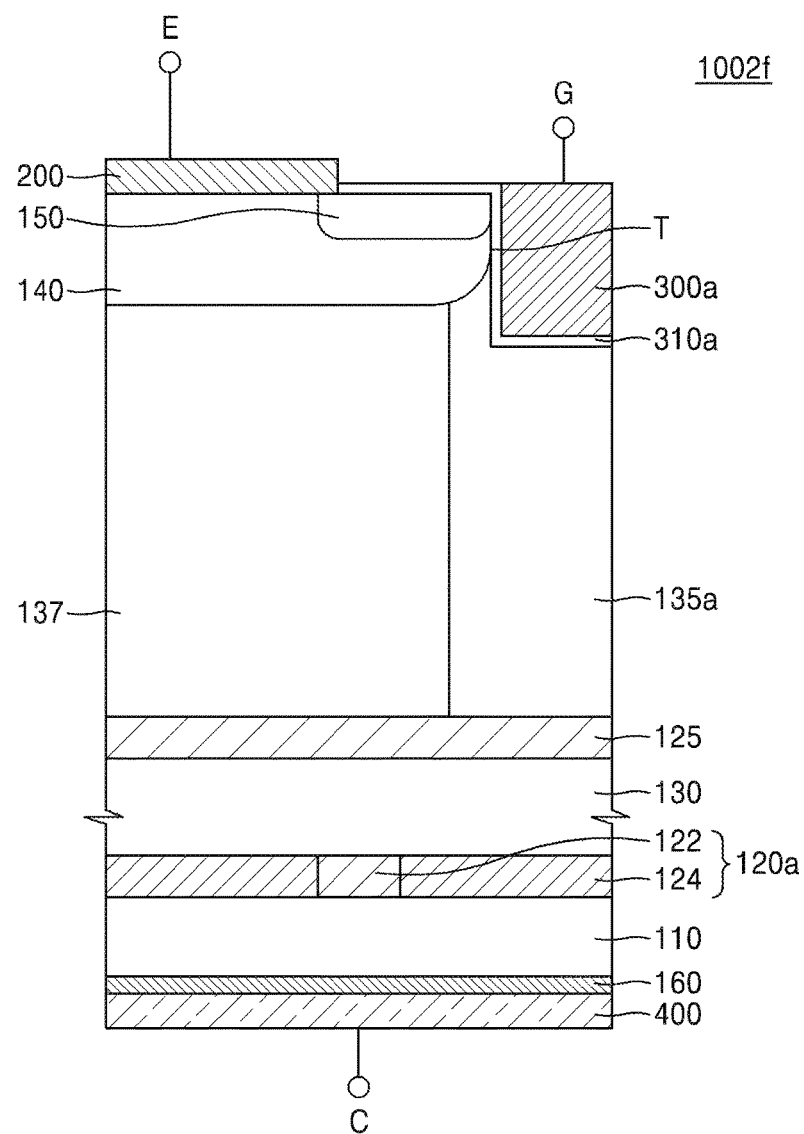

FIG. 28 is a cross sectional view illustrating a method for fabricating a power device according to an embodiment of the present disclosure. Specifically, FIG. 28 illustrates the steps after FIG. 7. Herein, any steps that may overlap with those in FIGS. 4 to 11 may be omitted.

Referring to FIG. 28, the first conductivity type pillar layer 135a may be formed by forming the second drift region 135 as illustrated in FIG. 8 by growing an epitaxial layer having the first conductivity type on the buried region 125, and then removing a portion of the second drift region 135, leaving the upper portion of the buried region 125 exposed. Next, the second conductivity type pillar layer 137 may be formed in a space in the removed portion of the second drift region 135, by growing an epitaxial layer having the second conductivity type.

Alternatively, the first conductivity type pillar layer 135a and the second conductivity type pillar layer 137 may be formed by the method described below. After a non-doped epitaxial layer (not illustrated), which is not doped, is formed on the buried region 125, a first conductivity type implant region (not illustrated) and a second conductivity type implant region (not illustrated) are formed on different portions of an upper area of the non-doped epitaxial layer, by ion-implanting the impurity ions of the first conductivity type and the second conductivity type on the upper area of the non-doped epitaxial layer. By repeating forming the non-doped epitaxial layer and forming the first and second conductivity type implant regions, a multilayer structure formed of a plurality of non-doped epitaxial layers is formed on the upper area, having the first and second conductivity type implant regions. Next, by the heat treatment, the first conductivity type impurity ions implanted into the upper area of each of the plurality of non-doped epitaxial layers are diffused, causing the first conductivity type implant regions to be connected with each other, thus forming the first conductivity type pillar layer 135a. At the same time, the impurity ions of the second conductivity type may be diffused to cause the second conductivity type implant regions to be connected with each other, thus forming the second conductivity type pillar layer 137. Depending on the conditions for the heat treatment to diffuse the impurity ions, the first conductivity type pillar layer 135a and the second conductivity type pillar layer 137 may be in contact with each other, as illustrated in FIG. 28. Alternatively, there may be a portion of the non-doped epitaxial layers remaining between the first conductivity type pillar layer 135a and the second conductivity type pillar layer 137.

In a similar manner as explained above with reference to FIG. 9, the base region 140 may be formed at a predetermined region of the surface of the upper portion of the first conductivity type pillar layer 135a and the second conductivity type pillar layer 137, and the emitter region 150 may be formed at a predetermined area of the upper surface within the base region 140.

FIGS. 29 to 33 are cross sectional views of power devices according to an embodiment of the present disclosure.

Referring to FIGS. 29 to 33, the power devices 1002b, 1002c, 1002d, 1002e, 1002f can be realized based on the description provided above with reference to FIGS. 1 to 28, as these are examples in which the second drift layer 135 of the power devices 1000b, 1000c, 1000d, 1000e, 1000f illustrated in FIGS. 13, 14, 19, 20 and 26 is replaced with the first conductivity type pillar layer 135a and the second conductivity type pillar layer 137 illustrated in FIG. 28. Accordingly, detailed description will be omitted for the sake of brevity.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A power device, comprising:
   a first field stop layer having a first conductivity type;
   a first drift region disposed on the first field stop layer and having the first conductivity type with an impurity concentration that is lower than an impurity concentration of the first field stop layer;
   a buried region disposed on and in contact with the first drift region and having the first conductivity type with an impurity concentration that is higher than an impurity concentration of the first drift region;
   a second drift region of the first conductivity type disposed on the buried region and having an impurity concentration lower than the impurity concentration of the buried region;
   a power device cell disposed at an upper portion of the second drift region;
   a collector region disposed below the first field stop layer; and a second field stop layer having the first conductivity type with an impurity concentration that is higher than the impurity concentration of first field stop layer, the first drift region having no portion disposed below any portion of the second field stop layer, the second field stop layer being disposed between the first field stop layer and the first drift region, the impurity concentration of the buried region having a maximum impurity concentration that is at least one of lower than the impurity concentration of the first field stop layer or lower than the impurity concentration of the second field stop layer, the first drift region and the second drift region each has a constant impurity concentration profile in a depth direction.

2. The power device of claim 1, wherein the first drift region is a single, continuous region.

3. The power device of claim 1, wherein the second field stop layer has an impurity concentration that increases from the first field stop layer to reach a maximum impurity concentration, and then decreases to the first drift region.

4. The power device of claim 1, wherein the first drift region is formed by an epitaxial growth on the second field stop layer.

5. The power device of claim 1, wherein the second field stop layer includes, on a same level, a first region having a first impurity concentration, and a second region having a second impurity concentration which is higher than the first impurity concentration.

6. The power device of claim 5, wherein an average impurity concentration of the second region is higher than an average impurity concentration of the first region.

7. The power device of claim 5, wherein the impurity concentrations of the first drift region and the second drift region are substantially the same.

8. The power device of claim 1, wherein the second drift region includes a first conductivity type pillar and a second conductivity type pillar, each of which are formed by extending on the buried region in a perpendicular direction and in alternate arrangement in a horizontal direction, and the first conductivity type pillar has a lower impurity concentration than an impurity concentration of the buried region.

9. The power device of claim 1, wherein the buried region comprises a first region having an increasing impurity concentration from the first drift region, and a second region adjacent to the first region and having a decreasing impurity concentration to the second drift region.

10. The power device of claim 9, wherein the buried region has an impurity concentration profile in which the first drift region and the second drift region are in a symmetric shape with reference to a portion having a maximum impurity concentration.

11. The power device of claim 1, wherein the collector region has a second conductivity type which is different from the first conductivity type.

12. The power device of claim 1, wherein a thickness value of the second drift region is larger than a thickness value of the first drift region.

13. The power device of claim 1, wherein the power device cell comprises:

a base region disposed at an upper portion of the second drift region and having a second conductivity type which is different from the first conductivity type;

an emitter region disposed on a surface portion within the base region and having the first conductivity type;

a gate electrode disposed on one side surface of the base region and the emitter region, and formed by being buried in the second drift region; and a gate insulating layer disposed between the base region, the emitter region and the second drift region, and the gate electrode.

14. The power device of claim 1, wherein the first field stop layer has a uniform impurity concentration over substantially an entire depth of the first field stop layer.

15. The power device of claim 1, wherein the second field stop layer is adjacent to and in contact with the first field stop layer.

16. The power device of claim 1, wherein the second field stop layer extends continuously from the first drift region to the first field stop layer.

17. The power device of claim 1, wherein the second field stop layer is in contact with the first drift region and in contact with the first field stop layer, the second field stop layer extends continuously in a depth direction from the first drift region to the first field stop layer.

18. The power device of claim 1, wherein the second drift region is in contact with the buried region.

19. A power device, comprising:

a first field stop layer having a first conductivity type;

a first drift region disposed on the first field stop layer and having the first conductivity type with an impurity concentration that is lower than an impurity concentration of the first field stop layer;

a buried region disposed on and in contact with the first drift region and having the first conductivity type with an impurity concentration that is higher than an impurity concentration of the first drift region;

a second drift region of the first conductivity type disposed on the buried region and having an impurity concentration lower than the impurity concentration of the buried region;

a power device cell disposed at an upper portion of the second drift region;

a collector region disposed below the first field stop layer; and a second field stop layer adjacent to and in contact with the first field stop layer, the second field stop layer being adjacent to and in contact with the first drift region, the second field stop layer having the first conductivity type, the second field stop layer having an impurity concentration that increases from the first field stop layer to reach a maximum impurity concentration, and then decreases to the first drift region, the second field stop layer extending continuously in a depth direction from the first drift region to the first field stop layer, the impurity concentration of the buried region having a maximum impurity concentration that is at least one of lower than an impurity concentration of the first field stop layer or lower than the impurity concentration of the second field stop layer, the first drift region and the second drift region each having a constant impurity concentration profile in a depth direction.

20. The power device of claim 19, wherein the second field stop layer is formed by an ion implantation process so that the impurity concentration is higher than the impurity concentration of the first field stop layer.

21. The power device of claim 19, wherein the second field stop layer includes, on a same level, a first region having a first impurity concentration, and a second region having a second impurity concentration which is higher than the first impurity concentration.

22. The power device of claim 19, wherein
the impurity concentrations of the first drift region and the second drift region are substantially the same.

23. The power device of claim 19, wherein the second drift region includes a first conductivity type pillar and a second conductivity type pillar, each of which are formed by extending on the buried region in a perpendicular direction and in alternate arrangement in a horizontal direction, and
the first conductivity type pillar has a lower impurity concentration than the buried region.

24. The power device of claim 19, wherein the buried region comprises a first region having an increasing impurity concentration from the first drift region, and a second region adjacent to the first region and having a decreasing impurity concentration to the second drift region,
the buried region has an impurity concentration profile in which the first drift region and the second drift region are in a symmetric shape with reference to a portion having a maximum impurity concentration.

25. The power device of claim 19, wherein a thickness value of the second drift region is larger than a thickness value of the first drift region.

26. The power device of claim 19, wherein the first drift region has no portion disposed below any portion of the second field stop layer.

27. The power device of claim 19, wherein the second drift region is in contact with the buried region.

* * * * *